US008369153B2

(12) United States Patent
Fujiu

(10) Patent No.: US 8,369,153 B2
(45) Date of Patent: Feb. 5, 2013

(54) SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE

(75) Inventor: Masaki Fujiu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/451,185

(22) Filed: Apr. 19, 2012

(65) Prior Publication Data

US 2012/0201083 A1  Aug. 9, 2012

Related U.S. Application Data

(63) Continuation of application No. 13/182,847, filed on Jul. 14, 2011, now Pat. No. 8,184,484, which is a continuation of application No. 13/030,770, filed on Feb. 18, 2011, now Pat. No. 8,023,331, which is a continuation of application No. 12/327,048, filed on Dec. 3, 2008, now Pat. No. 7,916,545.

(30) Foreign Application Priority Data

Dec. 4, 2007 (JP) ................................. 2007-313832

(51) Int. Cl.
*G11C 11/34* (2006.01)
(52) U.S. Cl. ............................... 365/185.19; 365/185.24
(58) Field of Classification Search ............. 365/185.19, 365/185.24
See application file for complete search history.

(56) References Cited

U.S. PATENT DOCUMENTS

| 5,642,309 | A | 6/1997 | Kim et al. |
|---|---|---|---|
| 7,355,887 | B2 | 4/2008 | Nakamura et al. |
| 7,499,329 | B2 | 3/2009 | Nazarian |
| 7,508,704 | B2 | 3/2009 | Honma et al. |
| 2002/0114187 | A1 | 8/2002 | Choi et al. |
| 2007/0025157 | A1 | 2/2007 | Wan et al. |
| 2007/0047326 | A1 | 3/2007 | Nguyen et al. |
| 2007/0109862 | A1 | 5/2007 | Kim et al. |
| 2007/0147141 | A1* | 6/2007 | Shibata ................... 365/189.09 |
| 2007/0297247 | A1 | 12/2007 | Hemink |

FOREIGN PATENT DOCUMENTS

| JP | 8-96591 | 4/1996 |
|---|---|---|
| KR | 0142368 | 4/1996 |

* cited by examiner

*Primary Examiner* — Michael Tran
(74) *Attorney, Agent, or Firm* — Oblon, Spivak, McClelland, Maier & Neustadt, L.L.P.

(57) ABSTRACT

A semiconductor memory device includes memory cells, word lines, a driver circuit, and a control circuit. The driver circuit repeats a programming operation of selecting any one of the word lines, of applying a first voltage to selected one of the word lines, and of applying a second voltage to unselected one of the word lines, to write data to selected one of the memory cells connected to the selected one of the word lines. The control circuit, while the driver circuit is repeating the programming operation, steps up the first voltage and keeps the second voltage constant until the first voltage reaches a first threshold. The control circuit steps up the second voltage after the first voltage has reached the first threshold.

17 Claims, 18 Drawing Sheets

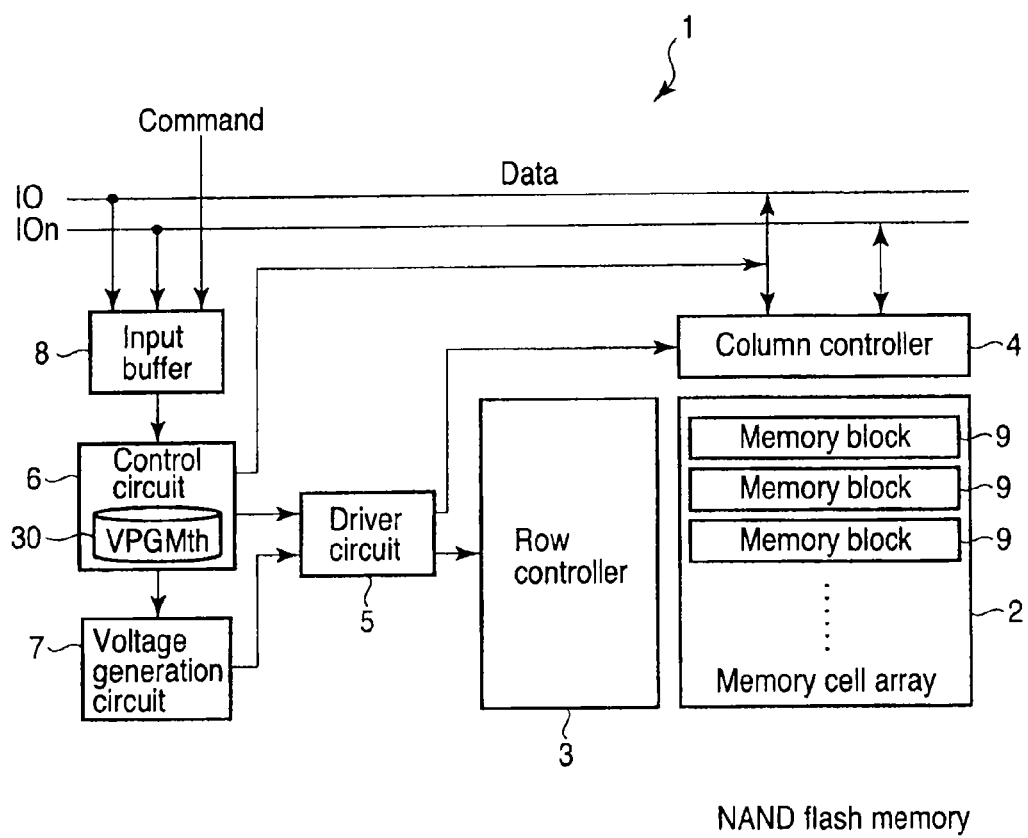
F I G. 1

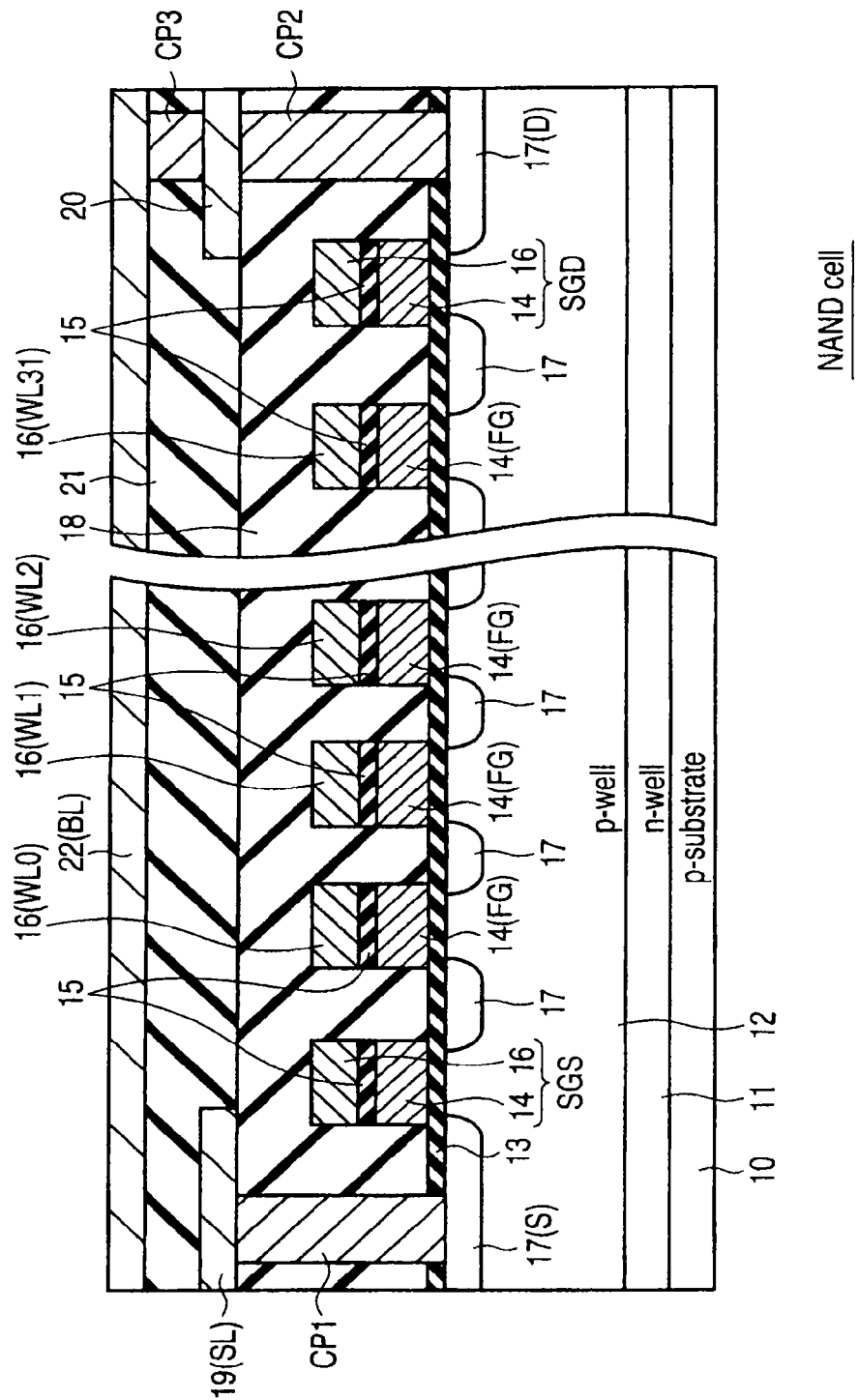
F I G. 3

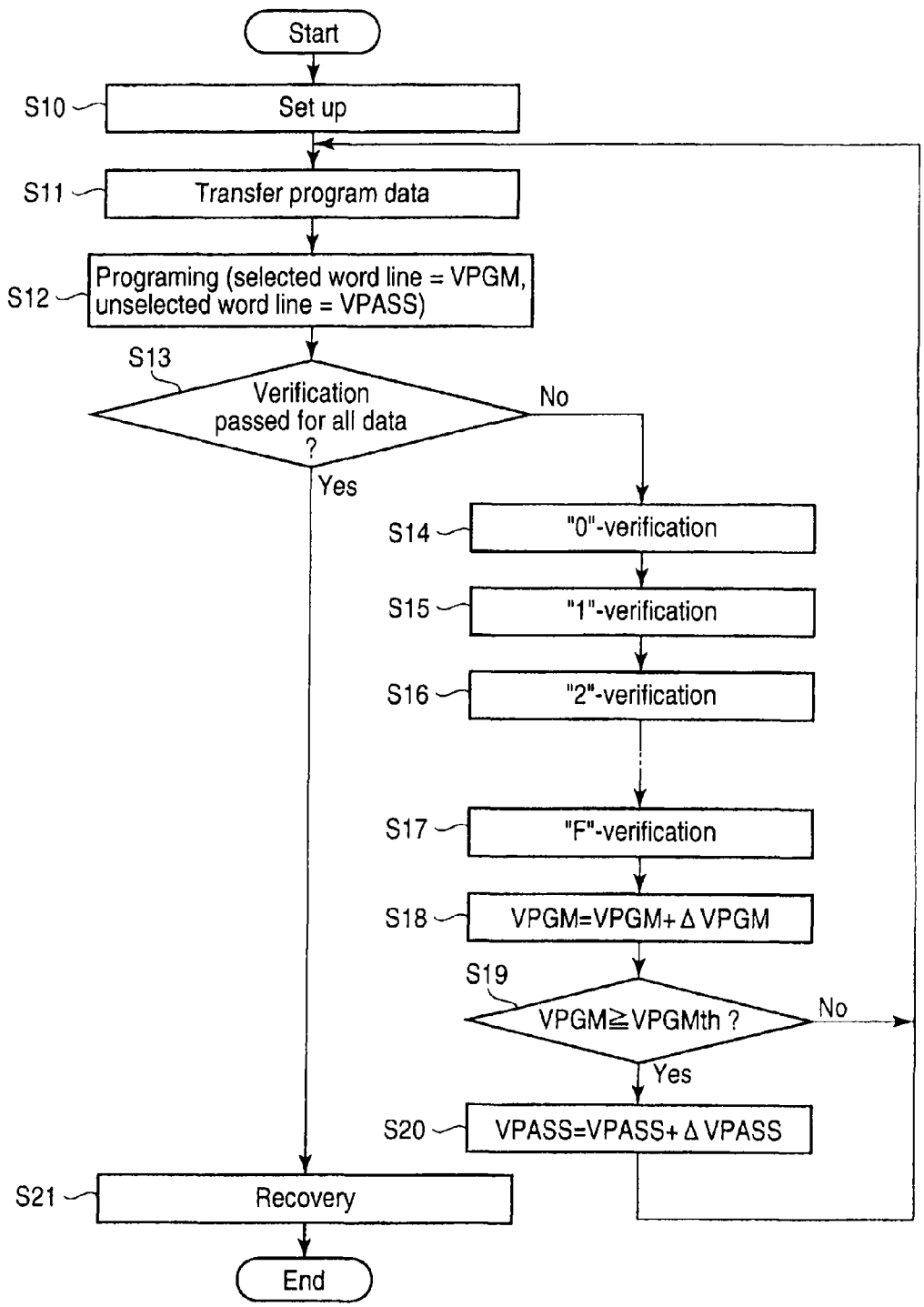
F I G. 5

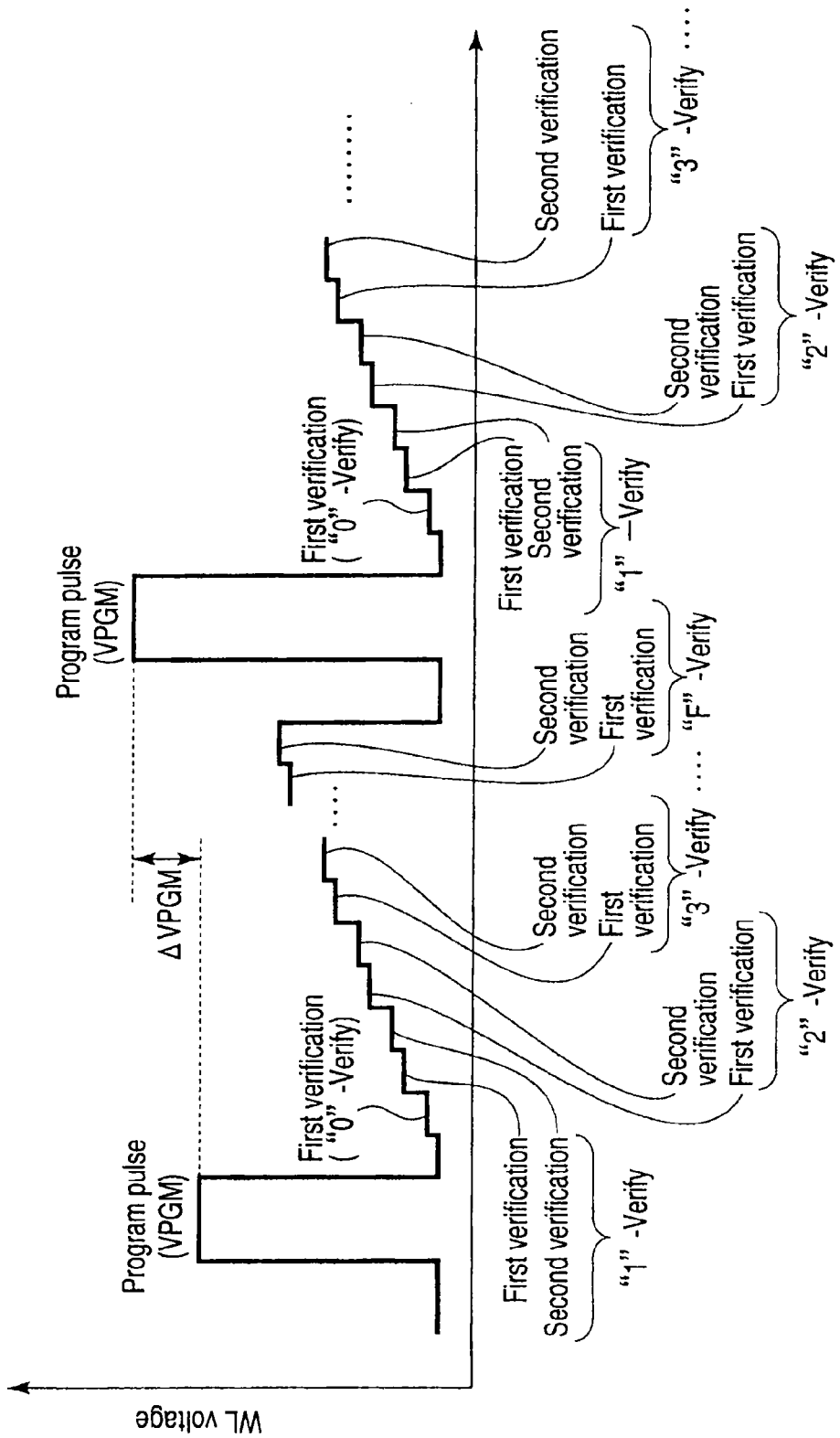
F I G. 17

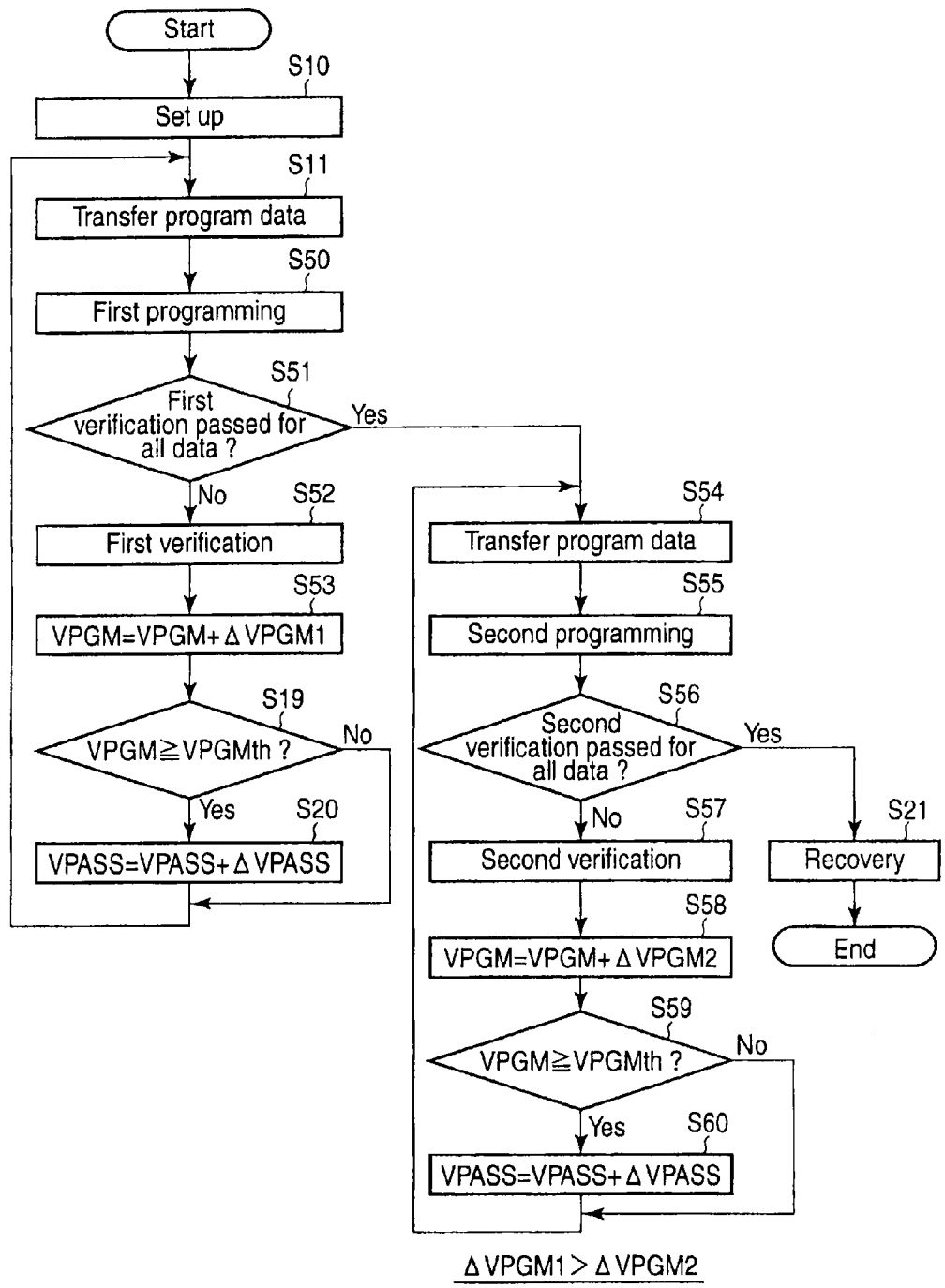
F I G. 18

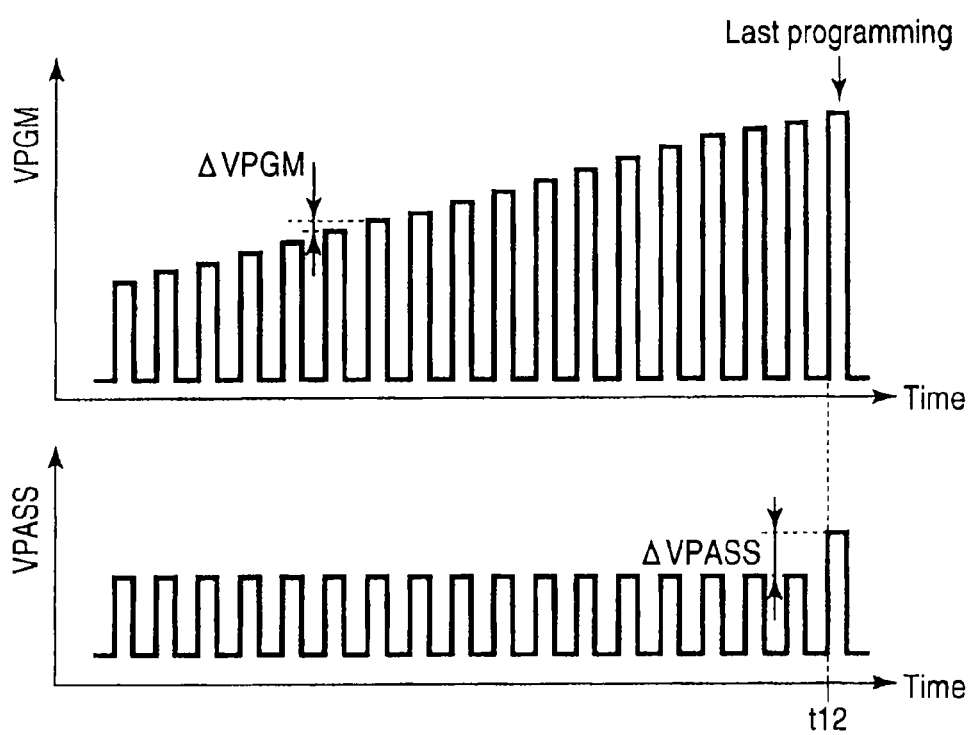
F I G. 21

SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE

CROSS-REFERENCE TO RELATED APPLICATIONS

This application is a continuation of and claims the benefit of priority from U.S. Ser. No. 13/182,847, filed Jul. 14, 2011, which is a continuation of U.S. Ser. No. 13/030,770, filed Feb. 18, 2011 now U.S. Pat. No. 8,023,331, which is a continuation of U.S. Ser. No. 12/327,048, filed Dec. 3, 2008 now U.S. Pat. No. 7,916,545, which claims the benefit of priority from Japanese Patent Application No. 2007-313832, filed Dec. 4, 2007, the entire contents of each of which are incorporated herein by reference.

BACKGROUND OF THE INVENTION

1. Field of the Invention

The present invention relates to a semiconductor memory device including a stacked gate having a charge accumulation layer and a control gate, and a method of writing data to the semiconductor memory device. The present invention relates to, for example, a technique for preventing erroneous writing to a NAND flash memory.

2. Description of the Related Art

NAND flash memories are conventionally known as non-volatile semiconductor memories. For the NAND flash memory, a self-boost scheme is commonly used which increases the channel potential of a write inhibited cell through coupling to a gate potential to prevent electrons from being injected into a charge accumulation layer in the cell.

In this case, a program voltage is applied to a selected word line a plurality of times so as to be stepped up for every application. Thus, to prevent an increase in a difference between the channel potential and gate potential of the write inhibited cell, a known technique also steps up a voltage applied to unselected word lines. Such a technique is disclosed in, for example, Jpn. Pat. Appln. KOKAI Publication No. 8-96591.

However, the above-described technique may disadvantageously excessively increase the voltage applied to the unselected word lines, resulting in erroneously write to memory cells connected to the unselected word lines.

BRIEF SUMMARY OF THE INVENTION

A semiconductor memory device according to an aspect of the present invention includes:

memory cells for which current paths are connected in series and each of which includes a charge accumulation layer and a control gate;

word lines each connected to the control gate of a corresponding one of the memory cells;

a driver circuit which repeats a programming operation of selecting any one of the word lines, of applying a first voltage to selected one of the word lines, and of applying a second voltage to unselected one of the word lines, to write data to selected one of the memory cells connected to the selected one of the word lines; and a control circuit which, while the driver circuit is repeating the programming operation, steps up the first voltage and keeps the second voltage constant until the first voltage reaches a first threshold, the control circuit stepping up the second voltage after the first voltage has reached the first threshold.

A method of writing data to a semiconductor memory device including memory cells for which current paths are connected in series and to each of which data is written by repeating programming a plurality of times, the method according to an aspect of the present invention includes:

programming data by applying a first voltage to gates of selected one of the memory cells and applying a second voltage which is lower than the first voltage, to gates of unselected one of the memory cells;

repeating the programming while stepping up the first voltage with the second voltage kept constant; and after the first voltage reaches the first threshold, performing the programming with the voltage applied to the gates of the unselected one of the memory cells changed to a third voltage which is different from the second voltage.

BRIEF DESCRIPTION OF THE SEVERAL VIEWS OF THE DRAWING

FIG. 1 is a block diagram of a flash memory according to a first embodiment of the present invention;

FIG. 3 is a sectional view of the memory cell array according to the first embodiment;

FIG. 5 is a flowchart of a write operation according to the first embodiment;

FIG. 17 is a timing chart of the voltage of a word line in a flash memory according to the fourth embodiment during programming and verification;

FIG. 18 is a flowchart of a write operation according to a fifth embodiment of the present invention;

FIG. 21 is a timing chart of VPGM and VPASS in a flash memory according to a fourth modification of the fourth embodiment during programming and verification

DETAILED DESCRIPTION OF THE INVENTION

[First Embodiment]

Figure 2:
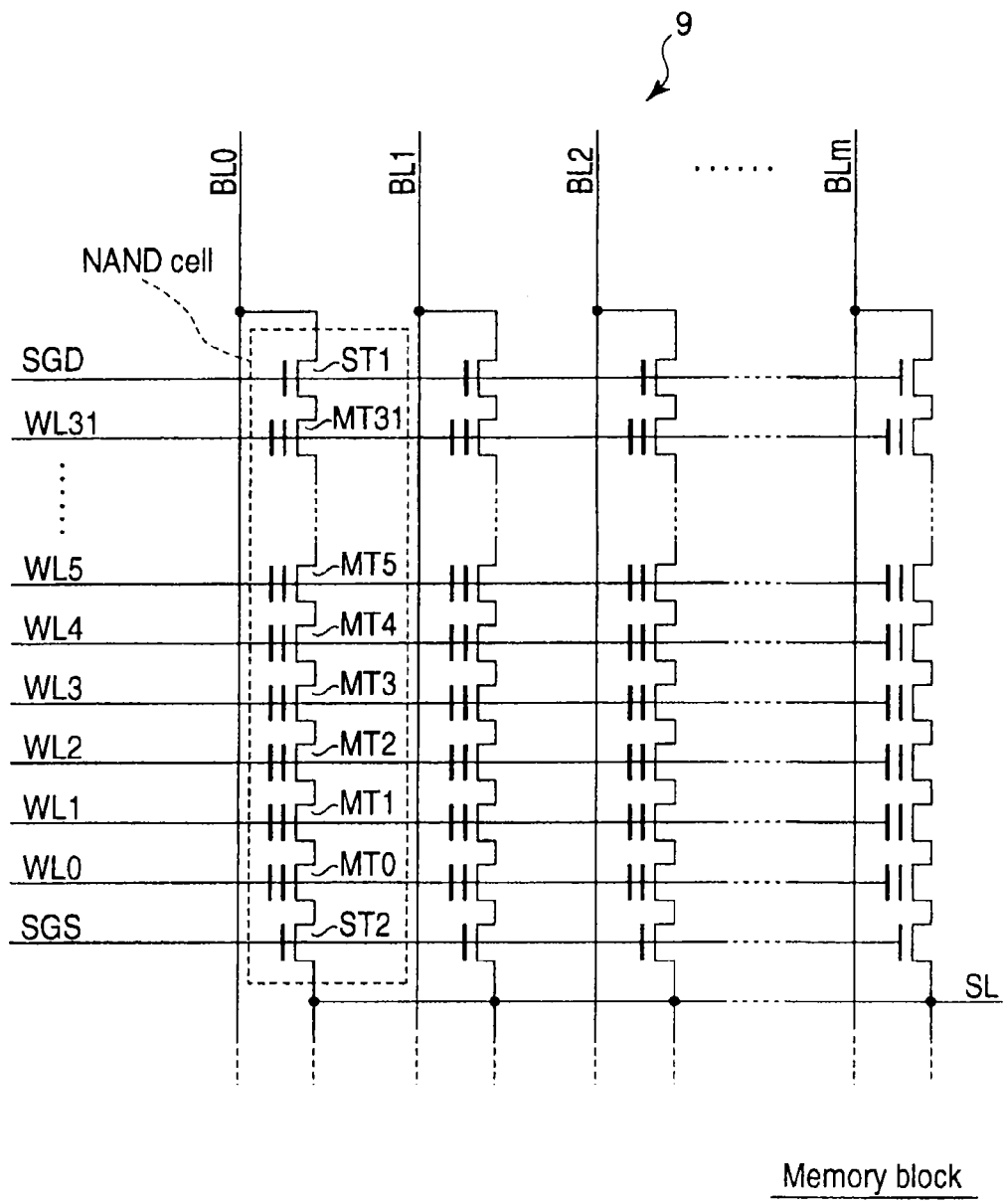
FIG. 2 is a circuit diagram of a memory cell array according to a first embodiment.

A semiconductor memory device and a method of writing data to the semiconductor memory device according to a first embodiment of the present invention will be described.

<Configuration of the NAND Flash Memory>

FIG. 1 is a block diagram of a NAND flash memory according to the present embodiment. As shown in the figure, a NAND flash memory 1 includes a memory cell array 2, a row controller 3, a column controller 4, a driver circuit 5, a control circuit 6, a voltage generation circuit 7, and an input buffer 8.

The memory cell array 2 includes a plurality of memory blocks 9. Each of the memory blocks 9 includes a plurality of memory cell transistors. Each of the memory cell transistors includes a gate connected to a word line, a drain electrically connected to a bit line, and a source electrically connected to a source line. Data is erased in units of the memory block 9. That is, data held in the memory cell transistors included in the same memory block 9 is erased at a time.

The input buffer 8 receives commands from an external source and receives addresses from the external source through I/O lines IO and IOn.

The control circuit 6 controls inputs to and outputs from the column controller 4 and operation of the driver circuit 5 and voltage generation circuit 7 according to addresses and commands provided by the input buffer 8. That is, the control circuit 6 controls voltages generated by the voltage generation circuit 7 during a data read operation, a data write operation, and a data erase operation. Based on the address, the control circuit 6 instructs the driver circuit 5 to perform selection for a row direction and a column direction of the memory cell array and to apply appropriate voltages to the word lines, the bit line, and a well region in which the memory cell array 2 is formed. The control circuit 6 also holds information on a threshold voltage VPGMth for a program voltage VPGM which is generated by the voltage generation circuit 7 during a write operation. This information will be described below.

The driver circuit 5 controls operation of the row controller 3 and the column controller 4 according to instructions from the control circuit 6.

In accordance with an instruction from the driver circuit 5, the row controller 3 performs selection for the row direction of the memory cell array 2, that is, selects any of the word lines. The row controller 3 applies voltages provided by the voltage generation circuit 7 via the driver circuit 5, to the selected word line, the unselected word lines, and the well region.

In accordance with an instruction from the driver circuit 5, the column controller 4 performs selection for the column direction of the memory cell array 2, that is, selects any of the bit lines. The column controller 4 amplifies data read to the bit line during a data read operation. The column controller 4 outputs the amplified read data to an external circuit via the I/O lines IO and IOn under the control of the control circuit 6. Moreover, during a data write operation, the column controller 4 transfers write data to the bit line. That is, the column controller 4 applies an appropriate voltage to the bit line according to the write data.

<Configuration of the Memory Cell Array>

Now, the memory blocks 9 held by the memory cell array 9 will be described in detail with reference to FIG. 2. FIG. 2 is a circuit diagram of the memory block 9.

As shown in the figure, the memory block 9 includes a plurality of NAND cells. Each of the NAND cells includes 32 memory cell transistors MT0 to MT31 and selection transistors ST1 and ST2. For simplification of description, when memory cell transistors MT0 to MT31 need not be distinguished from one another, each of the memory cell transistors MT0 to MT31 is sometimes simply referred to as the memory cell transistor MT. The memory cell transistor MT includes a stacked gate structure which includes a charge accumulation layer (for example, a floating gate) formed on the semiconductor substrate with a gate insulating film interposed therebetween and a control gate formed on the charge accumulation layer with an inter-gate insulating film interposed therebetween. The number of memory cell transistors MT is not limited to 32 but may be 8 or 16; the number of memory cell transistor MT is not limited. The adjacent memory cell transistors MT share a source and a drain. Current paths for the memory cell transistors MT are connected in series between the selection transistors ST1 and ST2. A drain of the memory cell transistor MT located at one end of the arrangement of the memory cell transistors MT is connected to a source of the selection transistor ST1. A source of the memory cell transistor MT located at the other end of the arrangement of the memory cell transistors MT is connected to a drain of the selection transistor ST2. That is, the NAND cell includes the two selection transistors ST1 and ST2 and the memory cell group including the plurality of memory cell transistors MT with the current paths for the memory cell transistors MT connected in series.

The control gates of the memory cell transistors MT on the same row are connected commonly to any one of word lines WL0 to WL31. The gates of the selection transistors ST1 and ST2 on the same row are connected commonly to select gate lines SGD and SGS, respectively. The drains of the selection transistors ST1 on the same column in the memory cell array 2 are connected commonly to any one of bit lines BL0 to BLM (m is a natural number). Sources of the selection transistors ST2 are connected commonly to a source line SL. Not both the selection transistors ST1 and ST2 are required. One of the selection transistors ST1 and ST2 may be omitted as long as the remaining selection transistor allows the NAND cell to be selected.

In the memory cell array 2 configured as described above, data is written to the plurality of memory cell transistors MT connected to the same word line WL at a time. A unit to which the data is written is referred to as a "page". In the present embodiment, for simplification, an example will be described in which the data is written to all the (m+1) memory cell transistors MT connected to the same word line at a time. A data read operation is performed with the same unit as that for the data write operation. However, the write and read operations need not necessarily be performed on all the memory cell transistors MT connected to the same word line. For example, among the memory cell transistors MT connected to the same word line, the write and read operations may be simultaneously performed on the memory cell transistors MT connected to the even-numbered bit lines (BL0, BL2, BL4, . . . ) or the memory cell transistors MT connected to the odd-numbered bit lines (BL1, BL3, BL5, . . . ). For example, if the data is written to the memory cell transistors MT connected to the even-numbered bit lines, the odd-numbered bit lines are handled as unselected bit lines, and vice versa.

Now, the sectional configuration of the NAND cell configured as described above will be described with reference to FIG. 3. FIG. 3 is a sectional view of the NAND cell taken along a bit line direction. As shown in the figure, an n-type well region 11 is formed in a surface region of a p-type semiconductor substrate 10. A p-type well region 12 is formed in a surface region of the n-type well region 11. A gate insulating film 13 is formed on the p-type well region 12. The gate electrodes of the memory cell transistors MT and the selection transistors ST1 and ST2 are formed on the gate insulating film 13. The gate electrodes of the memory cell transistors MT and the selection transistors ST1 and ST2 each include a polycrystalline silicon layer 14 formed on the gate insulating film 13, an inter-gate insulating film 15 formed on the polycrystalline silicon layer 14, and a polycrystalline silicon layer 16 formed on the inter-gate insulating film 15. The inter-gate insulating film 15 is formed of, for example, a silicon oxide film, or an ON film, an NO film, or an ONO film that is a stacked structure with a silicon oxide film and a silicon nitride film.

In the memory cell transistor MT, the polycrystalline silicon layer 14 functions as a charge accumulation layer (FG). On the other hand, the polycrystalline silicon layers 16 arranged adjacent to each other in a direction orthogonal to the bit lines are connected together and function as a control gate (word line WL).

In the selection transistors ST1 and ST2, the polycrystalline silicon layers 14 and 16 arranged adjacent to each other in a word line direction are connected together. The polycrystalline silicon layers 14 and 16 function as the select gate lines SGS and SGD. The polycrystalline silicon layer 14 may exclusively function as a select gate line. In this case, the potential of the polycrystalline silicon layers 16 in the selection transistors ST1 and ST2 is constant or floating.

An $n^+$-type impurity diffusion layer 17 is formed in a surface of the p-type well region 12 between the gate electrodes. The impurity diffusion layer 17 is shared by adjacent transistors and functions as a source (S) or a drain (D).

An interlayer insulating film 18 is formed on the p-type well region 12 so as to cover the memory cell transistors MT and the selection transistors ST1 and ST2. A contact plug CP1 is formed in the interlayer insulating film 18 so as to reach the impurity diffusion layer (source) 17 for the source-side selection transistor ST2. A metal wiring layer 19 connected to the contact plug CP1 is formed on the interlayer insulating film 18. The metal wiring layer 19 functions as a source line SL. A contact plug CP2 is formed in the interlayer insulating film 18 so as to reach the impurity diffusion layer (drain) 17 for the drain-side selection transistor ST1. A metal wiring layer 20 connected to the contact plug CP2 is formed on the interlayer insulating film 18.

An interlayer insulating film 21 is formed on the interlayer insulating film 18 so as to cover the metal wiring layers 19 and 20. A contact plug CP3 is formed in the interlayer insulating film 21 so as to reach the metal wiring layer 20. A metal wiring layer 22 connected to a plurality of the contact plugs CP3 is formed on the interlayer insulating film 21. The metal wiring layer 22 functions as the bit line BL.

<Data Held in the Memory Cell Transistor>

Figure 4:
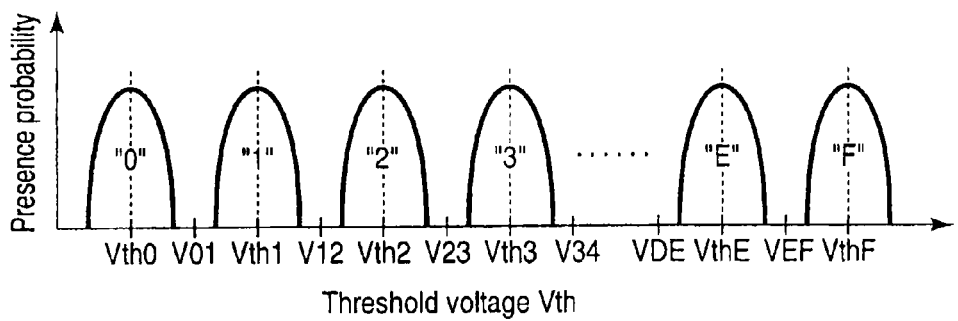
FIG. 4 is a graph showing a distribution of thresholds of memory cells according to the first embodiment.

Now, a distribution of thresholds of the memory cell transistors MT will be described with reference to FIG. 4. FIG. 4 is a graph showing a threshold voltage Vth on the axis of abscissa and the presence probability of the memory cell transistor MT on the axis of ordinate.

As shown in the figure, each of the memory cell transistors MT can hold data (4-bit data) of 16 levels. That is, the memory cell transistor MT can hold 16 types of data "0", "1", "2", "3", . . . , "9", "A", "B", . . . , "F" in order of increasing threshold voltage Vth. In the memory cell transistor MT, the threshold voltage Vth0 of "0" data is Vth0<V01. The threshold voltage Vth1 of "1" data is V01<Vth1<V12, and the threshold voltage Vth2 of "2" data is V12<Vth2<V23. The threshold voltage Vth3 of "3" data is V23<Vth3<V34, and the threshold voltage Vth4 of "4" data is V34<Vth4<V45. The threshold voltage Vth5 of "5" data is V45<Vth5<V56, and the threshold voltage Vth6 of "6" data is V56<Vth6<V67. The threshold voltage Vth7 of "7" data is V67<Vth7<V78, and the threshold voltage Vth8 of "8" data is V78<Vth8<V89. The threshold voltage Vth9 of "9" data is V89<Vth9<V9A, and the threshold voltage VthA of "A" data is V9A<VthA<VAB. The threshold voltage VthB of "B" data is VAB<VthB<VBC, and the threshold voltage VthC of "C" data is VBC<VthC<VCD. The threshold voltage VthD of "D" data is VCD<VthD<VDE, the threshold voltage VthE of "E" data is VDE<VthE<VEF. The threshold voltage VthF of "F" data is VEF<VthF.

In the example described in the present embodiment, the memory cell transistor MT is capable of holding the 16-level data. However, the memory cell transistor MT may hold data of 2 (binary), 4, 8, or 32 levels.

<Write Operation>

Figure 6:
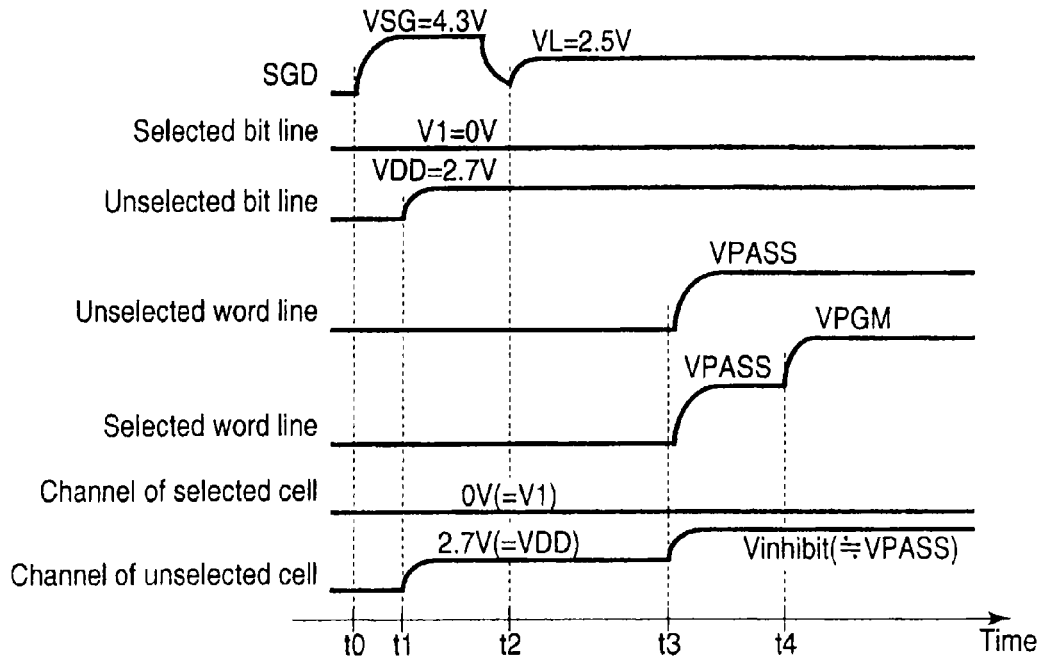
FIG. 6 is a timing chart of various voltages during programming in the flash memory according to the first embodiment.

Now, a write operation performed on the NAND flash memory configured as described above will be described with reference to FIGS. 5 and 6. FIG. 5 is a flowchart of the write operation. A write sequence according to the flowchart is carried out based on control performed by the control circuit 6 having received an external write command. FIG. 6 is a timing chart showing variations, during steps S11 and S12 in FIG. 5, in the potentials of the select gate line SGD, the selected bit line, the unselected bit line, the unselected word line, the selected word line, a channel of the memory cell transistor MT connected to the selected bit line, and a channel of the memory cell transistor MT connected to the unselected bit line. The memory cell transistors MT connected to the selected word line and the selected bit line (that is, the memory cell transistors MT to be programmed) are hereinafter sometimes referred to as the selected cell. The memory cell transistors MT connected to the selected word line and the unselected bit lines (that is, the memory cell transistors MT not to be programmed) are hereinafter sometimes referred to as the unselected cell.

As described above, data is written to all the memory cell transistors MT connected to the same word line at a time (the memory cell transistors MT correspond to one page). The data is sequentially written to the memory cell transistors MT in the memory block 9 in an erase state starting with the memory cell transistor MT located closest to the select gate line SGS. An operation of setting a potential difference between the control gate and the channel to inject charges into the charge accumulation layer to increase the threshold of the memory cell transistor MT is called "programming". Performing the programming a plurality of times increases the threshold of the memory cell transistor MT up to a desired value to allow the data write operation to be performed. Moreover, the bit line to which the memory cell transistors MT to be programmed are connected is hereinafter referred to as the selected bit line. The bit lines to which the memory cell transistors MT requiring no programming as a result of, for example, the increase in threshold to the desired value are connected are hereinafter referred to as the unselected bit lines.

First, the control circuit 6 receives the write command from an input buffer and then performs a setup operation (step S10). That is, the control circuit 6 instructs the voltage generation circuit 7 to start up a charge pump circuit (not shown in the drawings) provided in the voltage generation circuit 7, to generate a program voltage VPGM and an intermediate voltage VPASS (<VPGM). In response, the voltage generation circuit 7 generates the voltages VPGM and VPASS.

Then, the column controller 4 transfers data to be programmed, to the NAND cell (step S11). That is, the column controller 4 transfers voltages to the bit lines depending on write data received via the I/O lines IO and IOn. Before the write operation (that is, before step S10), the column controller 4 receives the write data from an external source via the I/O lines IO and IOn. In this case, the write data is held in a column data cache (not shown in the drawings) provided in the column controller 4. In step S11, in the column controller 4, the write data is transferred from the column data cache to a sense amplifier (not shown in the drawings), which further transfers the write data to the bit lines. In other words, the sense amplifier applies the voltages corresponding to the write data to the bit lines. The sense amplifier is a block that senses and amplifies read data during the data read operation. Details of step S11 will be described below with reference to FIG. 6.

That is, the in response to the instruction from the control circuit 6, the driver circuit 5 instructs the row controller 3 to select any one of the memory blocks. In response to the instruction from the driver circuit 5, the row controller 3 selects the select gate line SGD in any one of the memory blocks 9, and applies a voltage VSG (=VDD+Vth, where Vth denotes the threshold voltage of the selection transistor ST1) (time t0 in FIG. 6). VSG is, for example, 4.3V.

In response to an instruction from the control circuit 6, the driver circuit 5 instructs the column controller 4 to apply voltages corresponding to the write data to the bit lines BL. In response to the instruction from the driver circuit 5, the column controller 4 applies a voltage V1 (for example, 0V) to the bit line BL (selected bit line) to which the memory cell transistors MT to be programmed are connected. The column controller 4 applies a voltage VDD (for example, 2.7V) to the bit lines (unselected bit lines) to which the memory cell transistors MT not to be programmed are connected (time t1).

Then, the voltage VSG is applied to the select gate line SGD to turn on all the selection transistors ST1 in the selected memory block regardless of the potential of the bit line BL. As a result, the voltage V1 (for example, 0V) is transferred to the channel of the selected cell. The voltage VDD is transferred to the channel of the unselected cells. The select gate line SGS is at 0V, and the selection transistor ST2 is off during the write operation. For example, a voltage of about 1.6V is applied to the source line SL.

Then, in response to an instruction from the driver circuit 5, the row controller 3 changes the voltage of the select gate line SGD from the voltage VSG to the voltage VL (time t2). The voltage VL is, for example, lower than the voltage VDD, and prevents the selection transistor ST1 from transferring a voltage applied to the unselected bit lines. An example of the voltage VL is 2.5V. As a result, the selection transistor ST1 connected to the unselected bit line is in a cutoff state. Thus, the channels of all the memory cell transistors MT contained in the NAND cell connected to the unselected bit line are electrically separated from the unselected bit lines and are in an electric floating state. On the other hand, the selection transistor ST1 connected to the selected bit line remains on. Thus, the channels of all the memory cell transistors MT included in the NAND cell connected to the selected bit remain electrically connected to the selected bit line and have the voltage V1.

The details of step S12 have been described. After step S12, the row controller 3 programs data (step S12). Details of step S12 will be described below with reference to FIG. 6.

That is, in response to an instruction from the driver circuit 5, the row controller 3 applies the voltage VPASS to all the word lines WL0 to WL31 in the selected memory block 9 (time t3 in FIG. 6). The applied voltage VPASS turns on all the memory cell transistors MT regardless of held data, to form channels.

Then, in response to an instruction from the driver circuit 5, the row controller 3 selects any one of the word lines WL, and applies the program voltage VPGM to the selected word line. The row controller 3 applies the voltage VPASS to the unselected word lines (time t4).

The applied program voltage VPGM allows the data for the selected cells to be programmed. That is, for the memory cell transistors MT (selected cell) connected to the selected word line and the selected word bit line, the potential of the word line WL is VPGM, and the potential Vch of the channel is 0V. This results in a significant difference between the control gate 16 and the channel. As a result, charges are injected into the charge accumulation layer 14 by Fowler-Nordheim (FN) tunneling.

On the other hand, in the memory cell transistors MT connected to the selected word line and the unselected word lines, the channels float electrically. Thus, the potential Vch of the channel increases up to a write inhibition voltage Vinhibit owing to coupling to the program voltage VPGM, applied to the selected word line, and the voltage VPASS, applied to the unselected word lines (see time t3 and subsequent times in FIG. 6). The write inhibition voltage Vinhibit is substantially equal to VPASS. As a result, the potential difference between the control gate 16 and the channel is insufficient for the FN tunneling, preventing charges from being injected into the charge accumulation layer 14. Even if charges are injected into the charge accumulation layer 14, the threshold is prevented from changing to the degree that the data is programmed. Data programming is thus inhibited.

Figure 7:
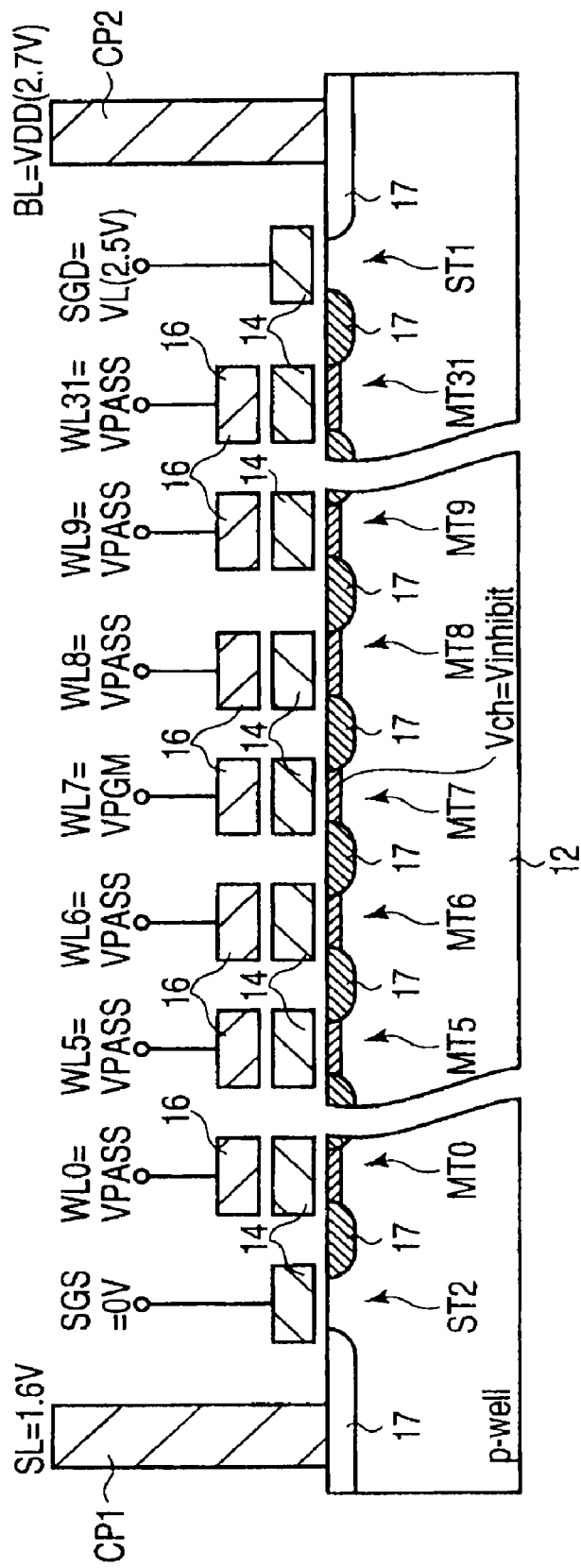
FIG. 7 is a sectional view of the memory cell array according to the first embodiment.

"Self-boosting" is a technique of allowing the channel of the NAND cell including the memory cell transistors MT not to be programmed to float electrically, to increase the channel voltage owing to coupling to the voltage VPASS applied to the unselected word lines, thus inhibiting programming. FIG. 7 shows the state of the NAND cell during self-boosting. FIG. 7 is a sectional view of the NAND cell connected to the unselected bit line, in which the word line WL7 is selected by way of example.

As shown in the figure, the voltage VPASS is applied to the unselected word lines WL0 to WL6 and WL8 to WL31. The program voltage VPGM is applied to the selected word line WL7. Thus, the memory cell transistors MT0 to MT31 are turned on to form channels. The channels are in electric connected, and in FIG. 7, electrically connected regions are shaded. On the other hand, VL is applied to the select gate line SGD, and VDD is applied to the unselected bit lines BL. Thus, the selection transistor ST1 is in the cutoff state. Consequently, the channels in the memory cell transistors MT0 to MT31 float electrically. The potential Vch of the channels increases up to the write inhibition voltage Vinhibit owing to coupling to the voltage VPASS, applied to the unselected word lines WL0 to WL6 and WL8 to WL31, and the program voltage VPGM, applied to the selected word line WL7. As a result, the unselected cells are inhibited from being programmed.

After the programming at step S12, the control circuit 6 references results of verification. The verification is a process of, after the programming, reading data from each of the memory cell transistors MT to determine whether or not the desired data has been written to the memory cell transistor MT. If the desired data has not been written to the memory cell transistor MT yet, the programming in step S12 is repeated. The state in which the threshold voltage of the memory cell transistor MT increases sufficiently to allow the device to determine that the desired data has been written is hereinafter expressed by the phrase "pass the verification". The state in which the threshold voltage of the memory cell transistor MT increases insufficiently to allow the device to determine that the data has not been completely written yet is hereinafter expressed by a phrase "the verification misses".

If the programming is the first programming of the write operation performed on the page, the verification is missed (step S13, NO), because the verification is not performed yet. Hence, the control circuit 6 performs verification about "0" data to "F" data (steps S14 to S17). That is, for example, when the memory cell transistor MT to which "1" data is to be written is verified, a voltage V01 (see FIG. 4) is applied to the word line WL as a verification voltage. If the memory cell transistor MT is not turned on, the verification is passed because the threshold voltage Vth1 is higher than V01. On the other hand, if the memory cell transistor MT is turned on, the verification misses because the threshold voltage Vth1 is lower than V01. If the verification misses, the programming needs to be performed again to set the threshold voltage Vth1 to be higher than V01. This also applies to the memory cell transistors MT to which the "2" to "F" data are written. To verify these data, voltages V12 to VEF are applied to the corresponding word lines. Verifications for the memory cell transistors MT to which the "1" to "F" data are written may simply be referred to as "1" to "F" verifications.

After the verification is completed, the control circuit 6 instructs the voltage generation circuit 7 to step up the program voltage VPGM. In response to the instruction, the voltage generation circuit 7 sets the program voltage VPGM= (VPGM+ΔVPGM). That is, the program voltage VPGM is stepped up by ΔVPGM (step S18).

The control circuit 6 determines whether or not the program voltage VPGM generated in step S18 reaches the threshold voltage VPGMth held in information 30. If the program voltage VPGM has reached the threshold voltage VPGMth (step S19, YES), the control circuit 6 instructs the voltage generation circuit 7 to step up the voltage VPASS. In response to the instruction, the voltage generation circuit 7 sets the voltage VPASS=(VPASS+ΔVPASS). That is, the voltage VPASS is stepped up by ΔVPASS (step S20). The threshold voltage VPGMth is, for example, 20V, and the ΔVPASS is approximately equal to (ΔVPGM×0.7). However, these values can be appropriately selected. Furthermore, execution of steps S18 to S20 need not necessarily follow execution of step S17 but may be after completion of the programming in step S12 and before the start of the next programming.

If the program voltage VPGM generated in step S18 has not reached the threshold voltage VPGMth (step S19, NO), the control circuit 6 avoids instructing the voltage generation circuit 7 to step up VPASS. Thus, the voltage VPASS, generated by the voltage generation circuit 7, is not changed.

Thereafter, the process returns to step S11 to perform the programming again. The memory cell transistors MT for which the verification is passed in steps S14 to S17 are inhibited from being programmed. That is, the bit lines to which these memory cell transistors MT are connected are determined to be unselected bit lines in step S11. The voltage VDD is applied to the unselected bit lines.

The above-described programming is repeated, and when all the selected cells pass the verification (step S13, YES), the data write operation is completed. The control circuit 6 performs recovery (step S21). That is, the control circuit 6 carries out, for example, a process of shutting down the charge pump circuit of the voltage generation circuit 7.

Figure 8:
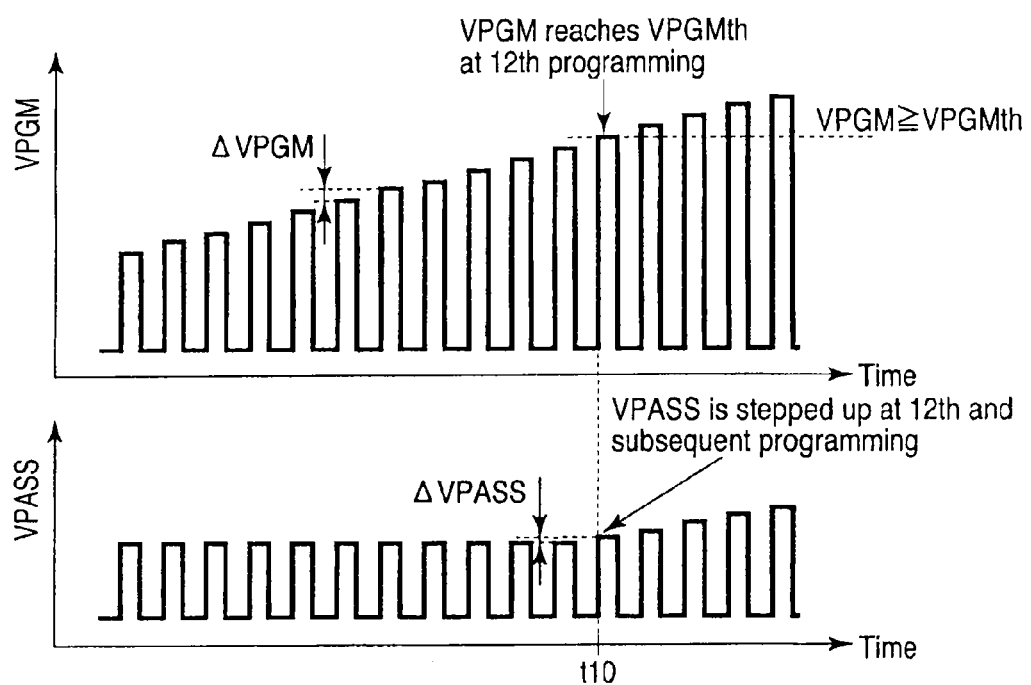
FIG. 8 is a timing chart of VPGM and VPASS during programming in the flash memory according to the first embodiment of the present invention.

Temporal variations in the program voltage VPGM and the voltage VPASS during the above-described write operation will be described with reference to FIG. 8. FIG. 8 is a timing chart of the program voltage VPGM and the voltage VPASS.

As shown in the figure, the program VPGM is stepped up by ΔVPGM every time the programming is repeated. On the other hand, the voltage VPASS remains constant until VPGM reaches VPGMth. Once, for example, during the twelfth programming at time t10, VPGM reaches VPGMth, then during the subsequent programmings, not only VPGM but also VPASS is stepped up by ΔVPASS.

<Effects>

Thus, the NAND flash memory according to the first embodiment of the present invention exerts the following effect.

(1) The operational reliability of the NAND flash memory can be improved (part 1).

In the above-described configuration, the voltage VPASS starts to be stepped up in the middle of the data write operation. Thus, data can be prevented from being erroneously written to the unselected cells, allowing the operational reliability of the NAND flash memory to be improved. This effect will be described below.

According to the conventional self-boost scheme, during repeated programming, VPGM is stepped up with VPASS remaining constant. Then, as the programming is repeated, the potential difference between the control gate and channel in the unselected cell increases. As a result, data may be erroneously written to the unselected cell (the memory cell transistors MT connected to the selected word line and the unselected bit lines).

Figure 9:
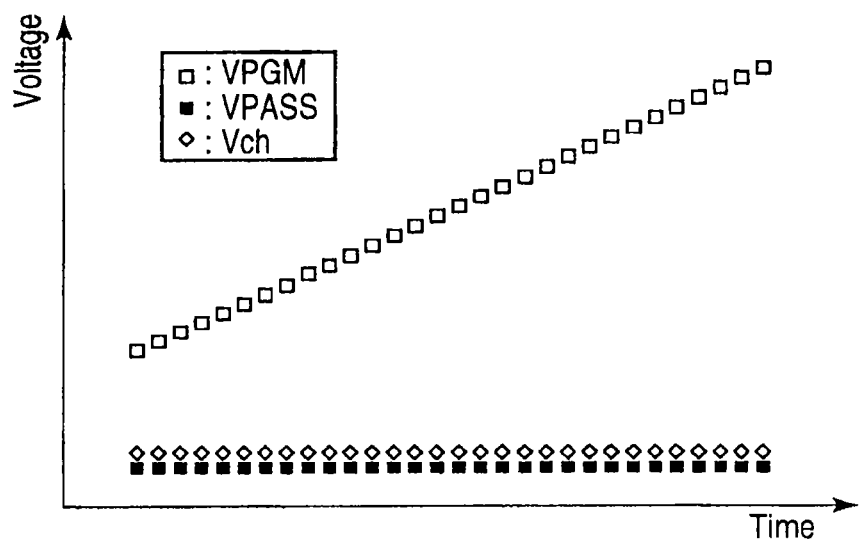
FIG. 9 is a graph showing variations in VPGM, VPASS, and Vch in a NAND flash memory.

FIG. 9 is a graph showing VPGM, VPASS, and the channel potential Vch of the unselected cell during repeated programming. In the figure, white rectangular marks indicate VPGM, black rectangular marks indicate VPASS, and white rhombic marks indicate the channel potential Vch of the unselected cell. As shown in the figure, VPASS is constant, and VPGM increases at predetermined step-up increments. The channel potential Vch of the unselected cell increases, though slightly, under the effect of coupling to VPGM. However, the increase in VPGM and the increase in Vch are not in a proportional relationship. The level of the increase in Vch is much lower than that of the step-up in VPGM. Thus, the potential difference between VPGM and Vch increases every time the programming is repeated.

Furthermore, as described in Description of the Related Art, the technique is known which starts stepping up VPASS at the beginning of the programming similarly to VPGM. However, in this case, VPASS is very large in the latter half of the repetition of the programming. As a result, data may be erroneously written to the memory cell transistors MT connected to the unselected word lines and the selected bit line.

In this regard, the NAND flash memory according to the present embodiment, VPASS starts to be stepped up in the middle of the repeated programming similarly to VPGM. More specifically, the control circuit 6 holds information 30 on the predetermined threshold voltage VPGMth. Then, when VPGM is less than VPGMth, VPASS is kept constant. Once VPGM reaches VPGMth, VPASS starts to be stepped up.

Thus, the channel potential Vch of the memory cell transistors MT included in the NAND cell connected to the unselected bit line can be set to be higher than that set if VPASS is kept constant. The channel potential Vch of the unselected cell can be defined by:

$$Vch = Vinit + \alpha \cdot (VPGM + n \cdot VPASS - n \cdot Vth)/n$$

where Vinit denotes the initial value of the program voltage VPGM, n denotes the number of memory cell transistors MT in the NAND cell, and α indicates the coupling ratio of the floating gate 14 to the control gate 16. To keep the write characteristics, the device is designed such that the coupling ratio α is kept constant in spite of a change in the generation of the design rule. Thus, stepping up VPASS enables a reduction in the potential difference between the control gate and the channel in the unselected cell. As a result, data can be inhibited from being erroneously written to the unselected cell (the memory cell transistors MT connected to the selected word line and the unselected bit lines).

Furthermore, the present method enables prevention of a possible excessive increase in VPASS compared to the technique of starting to step up VPASS at the beginning of the programming. Thus, data can also be inhibited from being erroneously written to the memory cell transistors MT connected to the unselected word lines and the selected bit line.

As described above, data is prevented from being erroneously written to the memory cell transistors MT other than those in the selected cell (the memory cell transistors MT connected to the selected word line and the selected bit line). The operational reliability of the NAND flash memory can thus be improved.

Figure 10:
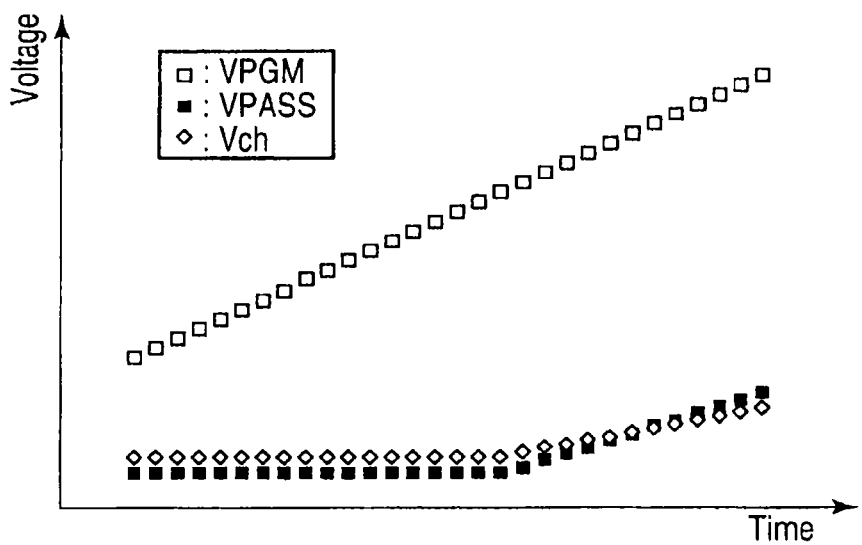
FIG. 10 is a graph showing variations in VPGM, VPASS, and Vch in the flash memory according to the first embodiment.

FIG. 10 is a graph showing VPGM, VPASS, and the channel potential Vch of the unselected cell during repeated programming. In the figure, white rectangular marks indicate VPGM, black rectangular marks indicate VPASS, and white rhombic marks indicate the channel potential Vch of the unselected cell.

As shown in the figure, VPASS starts to be stepped up in the middle of the write operation, with the channel potential Vch of the unselected cell increasing consistently with VPASS. This enables a reduction in the potential difference between VPGM and Vch, that is, the potential difference between the control gate and the channel compared to the case in which VPASS is always constant. In the example in FIG. 9, the relationship between VPASS and Vch is always VPASS<Vch. However, in the example in FIG. 10, the relationship between VPASS and Vch changes to VPASS>Vch in the middle of the write operation.

The above-described effect becomes more significant as the number of bits that can be held in the memory cell transistor MT increases. That is, the effect is more significant in a NAND flash memory with memory cell transistors MT holding data of at least 4 levels, for example, 16-level data than in a NAND flash memory with memory cell transistors MT holding binary data.

Namely, the range of the possible threshold voltage of the memory cell transistor MT increases consistently with the number of bits. In other words, the upper limit of the threshold voltage increases consistently with the number of bits. Consequently, the number of programmings needs to be increased. That is, VPGM is increased. Thus, an increase in the number of bits increases the likelihood of causing erroneously writes to the unselected cell. An increase in the number of bits also increases the percentage of unselected cells during the data write operation. That is, the number of unselected cells in conditions under which erroneously write are likely to occur increases. Therefore, applying the present embodiment to such a multi-level NAND flash memory is significantly effective for inhibiting erroneously writes in spite of increased VPGM.

[Second Embodiment]

Now, a semiconductor memory device and a method of writing data to the semiconductor memory device according to a second embodiment of the present invention will be described. The present embodiment corresponds to the above-described first embodiment in which the upper limits of VPASS is set. Only differences from the first embodiment will be described below.

The configuration of the NAND flash memory according to the present embodiment is similar to that shown in FIG. 1 and described in the first embodiment. However, the control circuit 6 holds not only the information 30 on the threshold voltage VPGMth of VPGM but also a threshold voltage VPGMth2 (larger than VPGMth) of VPGM for providing an upper limit of VPASS.

Figure 11:
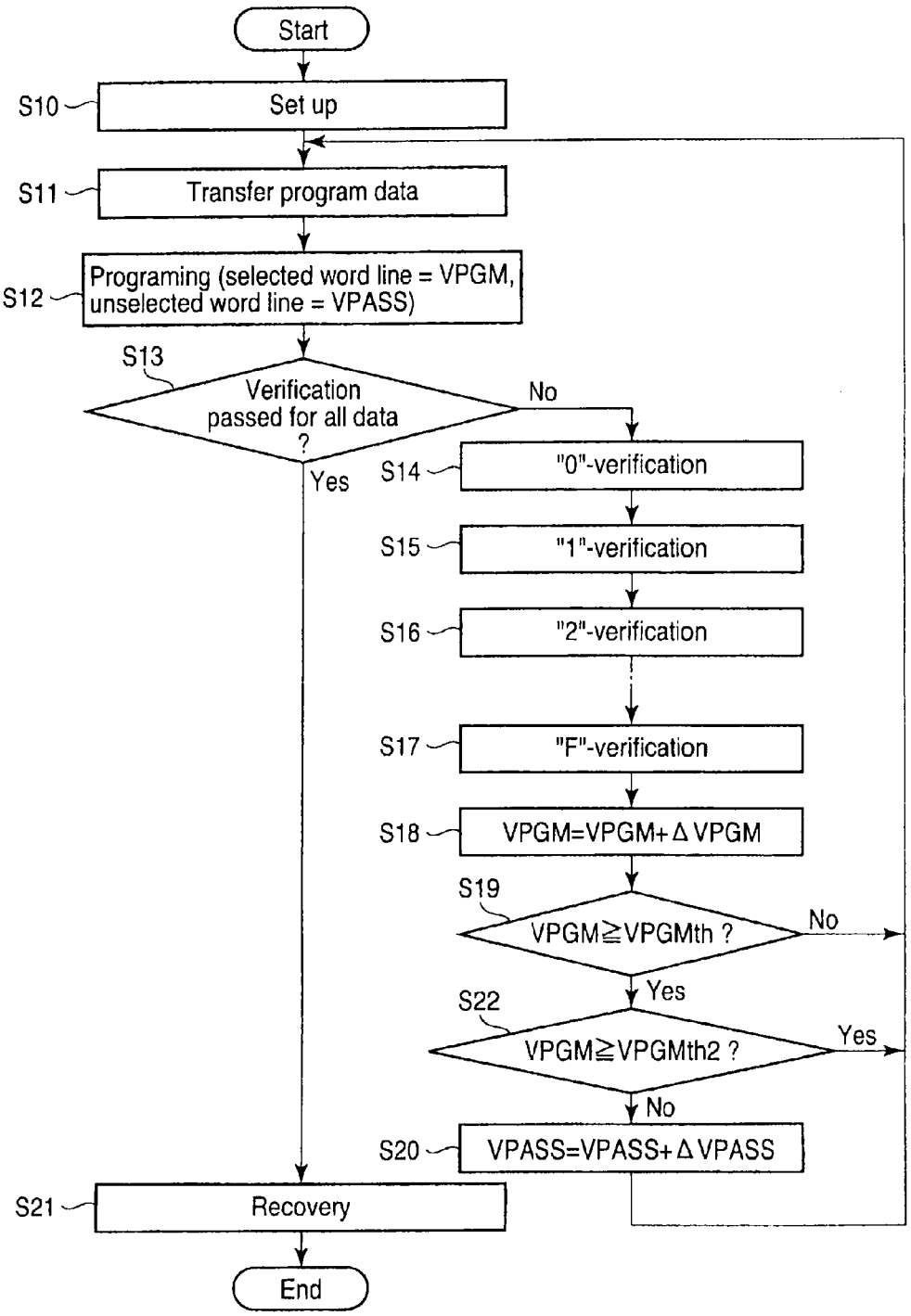
FIG. 11 is a flowchart of a write operation according to a second embodiment of the present invention.

FIG. 11 is a flowchart of a write operation performed on the NAND flash memory according to the present embodiment. As shown in the figure, steps S10 to S19 are the same as those in the first embodiment. In step S19, upon determining that VPGM has reached VPGMth, the control circuit 6 determines whether or not VPGM has reached VPGMth2. If VPGM has not reached VPGMth2 (step S22, NO), the process proceeds to step S20, where the control circuit 6 instructs the voltage generation circuit 7 to step up VPASS. The operation in this case is similar to that in the first embodiment. On the other hand, if VPGM has reached VPGMth2 (step S22, YES), the control circuit 6 omits the operation in step S20. That is, the step-up of VPASS is avoided, and VPASS used for the preceding programming is also used for the next programming.

Figure 12:
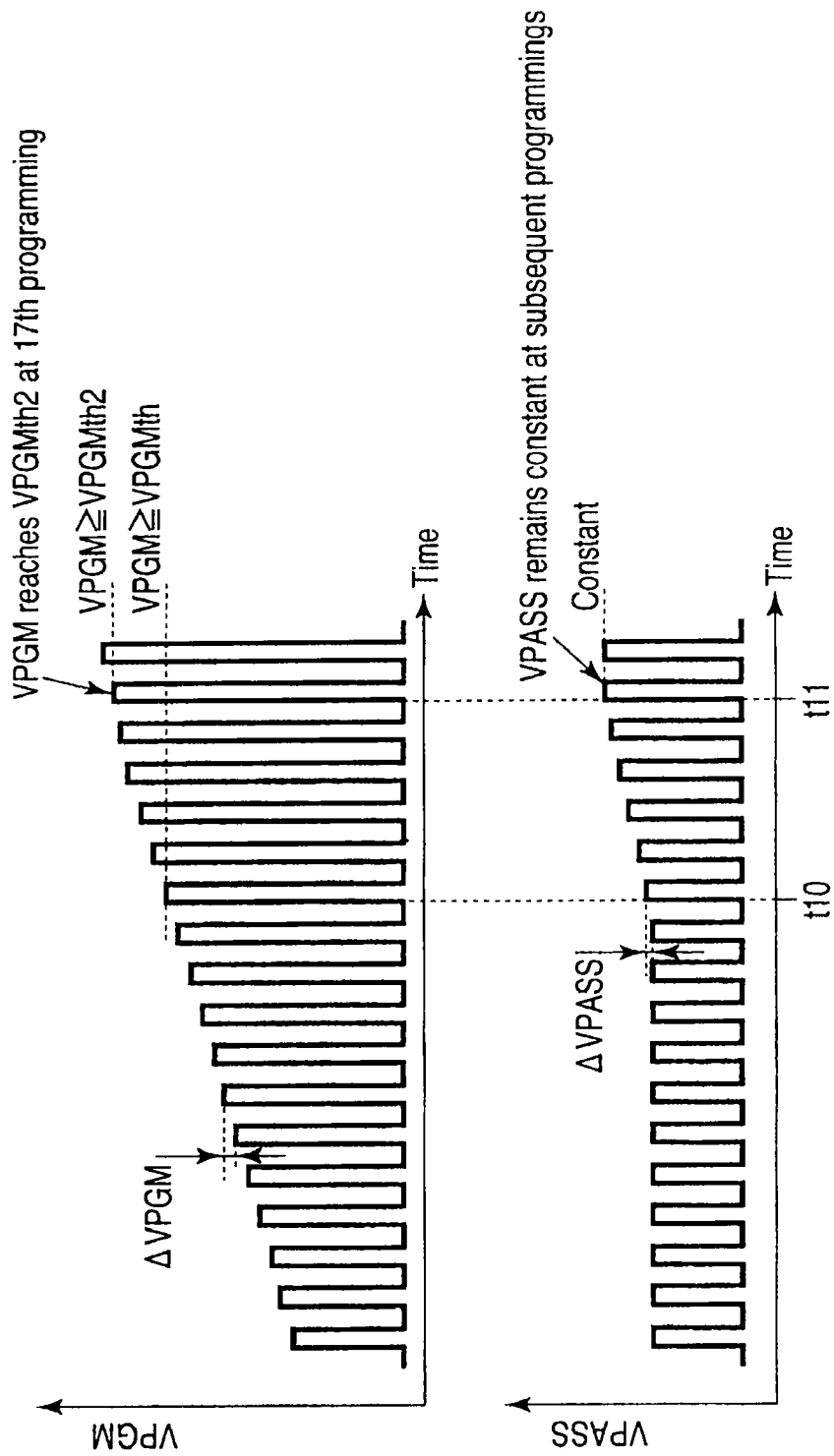
FIG. 12 is a timing chart of VPGM and VPASS during programming in a flash memory according to the second embodiment.

FIG. 12 is a timing chart of the program voltage VPGM and the voltage VPASS in the NAND flash memory according to the present embodiment. As shown in the figure, after the twelfth programming at time t10 when VPGM reaches VPGMth, VPASS is stepped up by ΔVPASS. Then, when VPGM reaches VPGMth2, for example, during the seventeenth programming at time t11, VPASS is kept constant again during the seventeenth and subsequent programmings.

As described above, the NAND flash memory according to the second embodiment of the present invention exerts not only the effect (1), described in the first embodiment, but also another effect (2).

(2) The operational reliability of the NAND flash memory can be improved (part 2).

With the configuration according to the present embodiment, upon detecting that VPGM has reached the threshold voltage VPGMth2, the control circuit 6 instructs the voltage generation circuit 7 to stop the stepping up VPASS. Thus, for example, even with a sharp increase in the number of programmings, VPASS can be prevented from increasing up to an unexpectedly large value. Consequently, data can be inhibited from being erroneously written to the memory cell transistors MT connected to the selected bit line and the unselected word lines. The operational reliability of the NAND flash memory can be improved.

[Third Embodiment]

Now, a semiconductor memory device and a method of writing data to the semiconductor memory device according to a third embodiment of the present invention will be described. The present embodiment corresponds to the above-described first embodiment in which only the first programming and the last programming are verified. Only differences from the first embodiment will be described below, with description of similar arrangements omitted.

Figure 13:
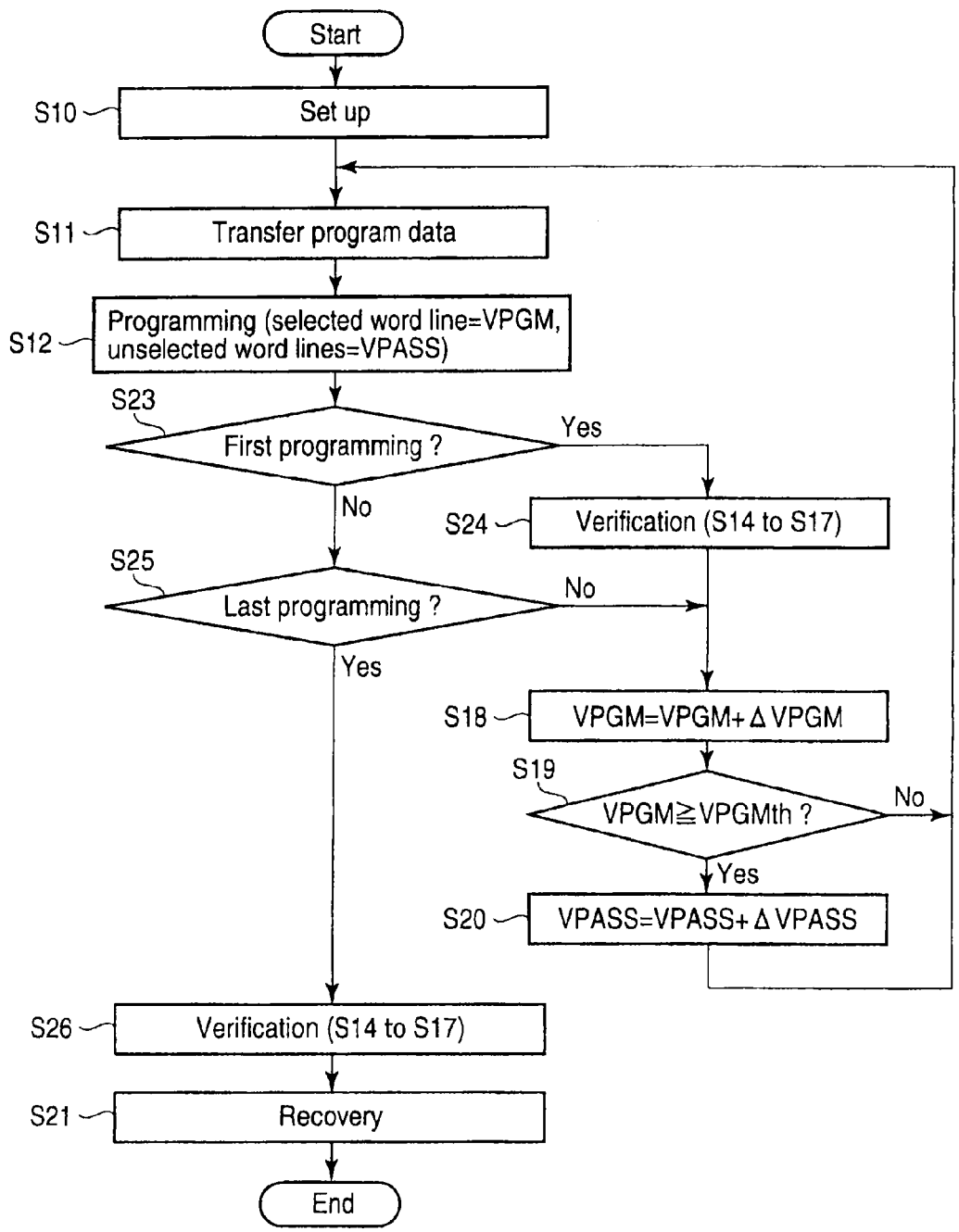
FIG. 13 is a flowchart of a write operation according to a third embodiment of the present invention.

FIG. 13 is a flowchart of a write operation performed on the NAND flash memory according to the present embodiment. As shown in the figure, steps S10 to S12 are similar to those in the first embodiment. If the programming in step S12 is the first programming of the write operation performed on the page (step S23, YES), the control circuit 6 performs verification (step S24). This operation is similar to that in steps S14 to S17, described in the first embodiment with reference to FIG. 5. The process then proceeds to step S18.

If the programming is neither the first programming (step S23, NO) nor the last programming of the write operation performed on the page (step S25, NO), the process proceeds to step S18. That is, in this case, the programming is performed using stepped-up VPGM without the need for verification.

If the programming is the last programming (step S25, YES), the control circuit 6 performs verification (step S26). The control circuit 6 thereafter performs recovery (step S21) to complete the write operation.

That is, in the write operation performed on a certain page by repeating programming a plurality of times, the configuration according to the present embodiment performs the verification only for the first and last programming. The present technique enables unnecessary verifications to be omitted, allowing an increase in the speed of the write operation. The first embodiment is applicable even to such a NAND flash memory. Of course, not only the first embodiment but also the second embodiment is applicable to the NAND flash memory. That is, after step S19, whether or not to step up VPASS may be determined depending on whether or not VPGM has reached VPGMth2. Furthermore, although not shown in FIG. 13, if all the selected cells pass the verification in step S24, then the subsequent operations may be omitted, and the process may proceed to step S21.

[Fourth Embodiment]

Now, a semiconductor memory device and a method of writing data to the semiconductor memory device according to a fourth embodiment of the present invention will be described. The present embodiment corresponds to the above-described first embodiment in which the programming operation is divided into two stages, first programming and second programming. Thus, the verification operation is also divided into first verification and second verification. Only differences from the first embodiment will be described below.

Figure 14:
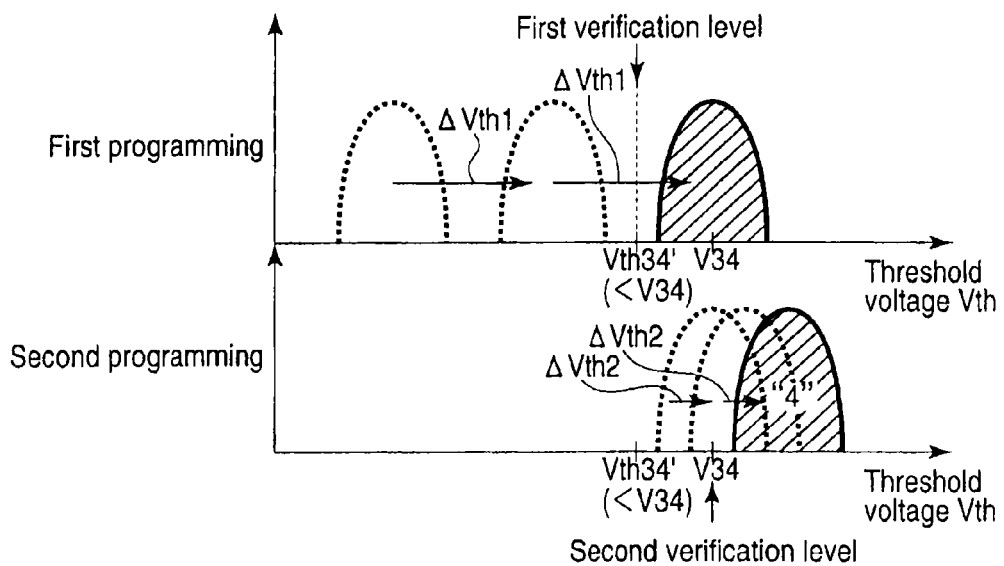
FIG. 14 is a flowchart of a write operation according to a fourth embodiment of the present invention.

First, a concept of a write operation performed on a NAND flash memory according to the present embodiment will be generally described. FIG. 14 is a graph showing a variation in the threshold voltage of the memory cell transistor MT observed during performance of the first and second programmings. In the description below, "4" data is written to the memory, by way of example.

First, the first programming is repeated to increase the threshold voltage from an erase level to a given level. The first programming is performed until the threshold voltage exceeds a first verification level V34' that is lower than V34, the verification level of the "4" data. A variation ΔVth1 in threshold voltage resulting from each performance of the first programming is relatively large. During the first programming, VPGM is applied to the word lines, and the voltage V1 (for example, 0V) is applied to the selected bit line, as described in the first embodiment.

Once the memory cell transistor MT passes the first verification, the second programming is performed. The first verification is an operation of determining whether or not the threshold voltage has reached the first verification level V34'. Then, the second programming is repeated to increase the threshold voltage until the threshold voltage exceeds the verification level V34 (hereinafter referred to as the second verification level according to the present embodiment) of the "4" data. A variation ΔVth2 in threshold voltage resulting from each performance of the second programming is smaller than ΔVth1. To set ΔVth2 to be smaller than ΔVth1, a voltage V2 (>V1, for example, about 0.4V) that is higher than V1 (for example, 0V) is applied to the selected bit line during the second programming. This also applies to the first and second programmings and the first and second verifications for data other than the "4" data.

Figure 15:
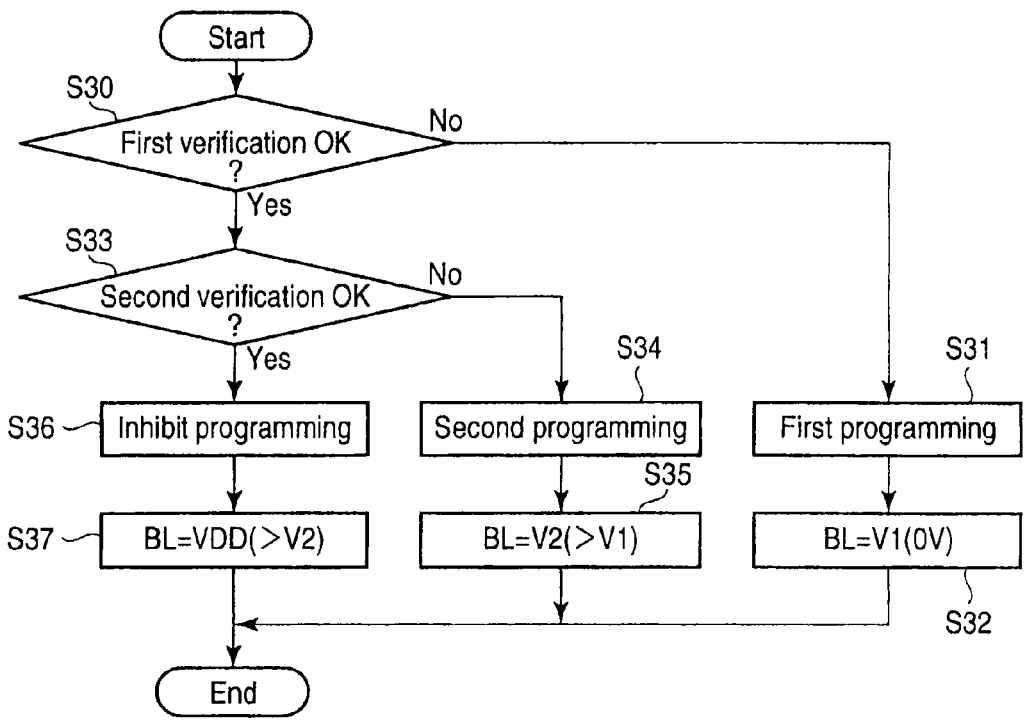
FIG. 15 is a flowchart of a programming operation according to the fourth embodiment.

That is, in the write operation according to the present embodiment, first, the programming is roughly performed. Then, when the threshold voltage approaches the predetermined value, the programming is starts to be closely performed. FIG. 15 shows a flow of the programming as a flowchart. As shown in the figure, if the first verification misses (step S30, NO), the first programming is performed (step S31). In the first programming, the column controller 4 applies the voltage V1 (0V) to the selected bit line (step S32).

If the first verification is passed (step S30, YES) and the second verification misses (step S33, NO), the second programming is performed (step S34). In the second programming, the column controller 4 applies the voltage V2 (>V1) to the selected bit line (step S35).

If the second verification is passed (step S33, YES), the programming is inhibited (step S36). Thus, the voltage VDD (>V2) is applied to the bit lines (unselected bit lines) (step S37). Once the second verification is passed for all the memory cell transistors MT, the write operation is completed.

Figure 16:
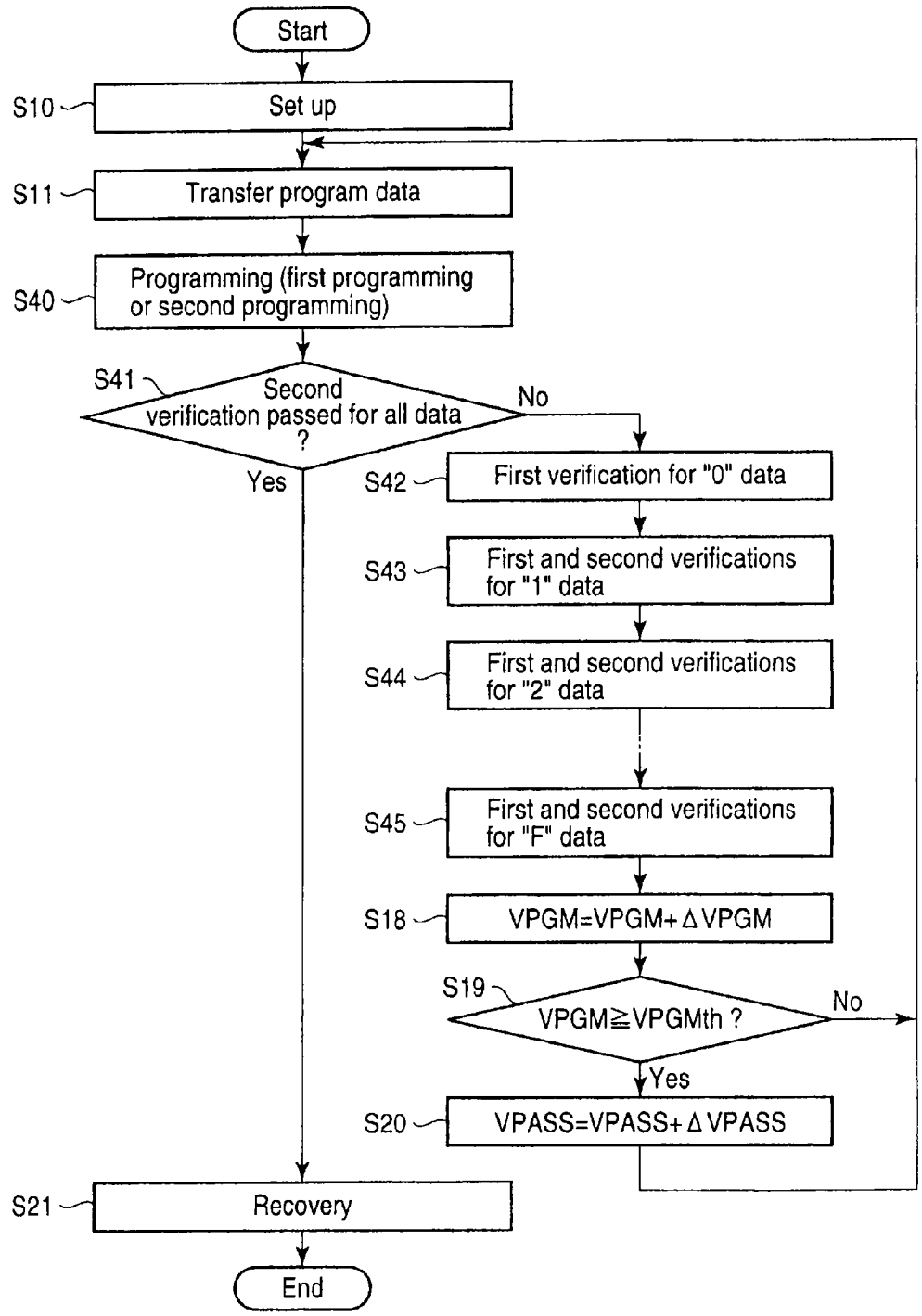
FIG. 16 is a flowchart of a write operation according to the fourth embodiment.

Now, the general flow of the write operation performed on the NAND flash memory configured as described above will be described with reference to FIG. 16. FIG. 16 is a flowchart of the write operation.

Roughly speaking, the data write operation according to the present embodiment is repetition of the programming operation and the verification operation as is the case with the first embodiment. However, in the present embodiment, the first and second programmings are performed as a programming operation, and the first and second verifications are performed as a verification operation.

As shown in FIG. 16, the operations in steps S10 and S11 are performed as is the case with the first embodiment. The voltage applied to the selected bit line in step S11 varies depending on the results of the first and second verifications. In an initial programming, the voltage V1 is applied to the selected bit line. In the subsequent programmings, the voltage V1 is applied again to the selected bit line to which the memory cell transistors MT for which the first verification has missed are connected. The voltage V2 is applied to the selected bit line to which the memory cell transistors MT for which the first verification has been passed but the second verification has misses are connected.

Then, the programming is performed (step S40). In step S40, the first or second programming is performed. That is, the first programming is performed on the memory cell transistor MT connected to the selected bit line to which the voltage V1 is applied in step S11. The second programming is performed on the memory cell transistor MT connected to the selected bit line to which the voltage V2 is applied in step S11. The remaining part of the operation is similar to that in step S12, described in the first embodiment.

After the programming in step S40, the control circuit 6 references the results of the verification. If all the memory cell transistors MT have passed the second verification, the process proceeds to step S21 to complete the write operation.

If the second verification has missed for any memory cell transistor MT, the control circuit 6 performs the verification for the "0" data to the "F" data (steps S42 to S45). That is, first, the first verification is performed for the "0" data (step S42). Thereafter, the first and second verifications are performed for each of the "1" to "F" data (steps S43 to S45).

After step S45, the operations in steps S18 to S20, described in the first embodiment, are performed. The process then returns to step S11.

The voltage of the word lines during the above-described write operation will be described below with reference to a timing chart in FIG. 17. FIG. 17 is a timing chart showing the voltage of the selected word line during the programming and verification of the write operation in FIG. 16.

As shown in the figure, first, the voltage VPGM is applied to the selected word line for the first or second programming. The verification is performed (steps S41 and S42). As described above, the verification operation includes the first and second verifications. For the second verification for the "1" to "F" data, voltages V01 to VEF are respectively applied to the selected word line. In contrast, for the first verification for the "1" to "F" data, voltages V0' to VEF' that are lower than the voltages V01 to VEF, respectively, are applied to the selected word line. The first verification is also performed for the "0" data.

More specifically, first, the first verification is performed for the "0" data. Then, for the "1" data, the first and second verifications are sequentially performed. Then, for the "2" data, the first and second verifications are sequentially performed. Thereafter, similarly, the first and second verifications are sequentially performed for each of the "3" to "F" data. In the present example, $\Delta$VPGM is constant.

As described above, the NAND flash memory according to the fourth embodiment of the present invention exerts not only the effect (1), described in the first embodiment, but also another effect (3).

(3) Write accuracy can be improved, with the speed of the data write operation increased.

For the NAND flash memory according to the present embodiment, the programming operation includes the first programming, in which the threshold voltage varies by $\Delta$Vth1, and the second programming, in which the threshold voltage varies by $\Delta$Vth2 (<$\Delta$th1), as described with reference to FIG. 14.

According to the first programming, the threshold voltage of the memory cell transistor MT is set to a level that is slightly lower than that of the desired threshold voltage. In this case, since the threshold voltage varies significantly according to the first program, the number of programmings can be reduced, allowing the write speed to be increased.

Furthermore, the threshold voltage of the memory cell transistor MT is set to the desired value according to the second programming, following the first programming. At this time, the second programming enables the threshold to be precisely set, allowing the write accuracy to be enhanced.

The present embodiment is applicable to the second and third embodiments. That is, in the flowchart in FIG. 16, the operation in step S22, described in the second embodiment, may be performed after step S19. In this case, effect 2, described in the second embodiment, can also be exerted. Alternatively, the first and second verifications may be performed only for the first and last programmings as described in the third embodiment. In this case, the write speed can further be increased.

[Fifth Embodiment]

Now, a semiconductor memory device and a method of writing data to the semiconductor memory device according to a fifth embodiment of the present invention will be described. The present embodiment implements the method shown in FIG. 14 and described above in the fourth embodiment, using another technique.

More specifically, the first programming and the first verification are performed with the step-up range $\Delta$VPGM of the programming voltage set to $\Delta$VPGM1. Then, after all the memory cell transistors pass the first verification, the second programming and the second verification are performed with $\Delta$VPGM set to $\Delta$VPGM2 (<$\Delta$VPGM1). In the present embodiment, during the first and second programmings, the same voltage, V1 (0V), is applied to the selected bit line. The first and second programmings differ in the magnitude of $\Delta$VPGM.

That is, in the second programming according to the fourth embodiment, the voltage V2 (>V1) is applied to the bit line to reduce the variation in the potential difference between the channel and the gate and thus the variation $\Delta$Vth in the threshold for the memory cell transistor. In contrast, in the second programming according to the present embodiment, $\Delta$VPGM is reduced to decrease the variation in the potential difference between the channel and the gate and thus the variation $\Delta$Vth in the threshold for the memory cell transistor.

FIG. 18 is a flowchart of a write operation performed on a NAND flash memory according to the present embodiment.

As shown in the figure, the operations in steps S10 and S11 are performed as is the case with the first embodiment. In step S11, as is the case with the first to third embodiments, the voltage V1 (0V) is applied to the selected bit line, and the voltage VDD is applied to the unselected bit lines. Thus, the first programming is performed (step S50).

After the programming in step S50, the control circuit 6 references the results of the verification. If the first verification has missed for any memory cell transistor MT (step S51, NO), the control circuit 6 performs the first verification for the "0" data to the "F" data (step S52). Then, the control circuit 6 instructs the voltage generation circuit 7 to step up VPGM. At this time, the VPGM is stepped up by $\Delta$VPGM1 (step S53). Thereafter, the operations in steps S19 and S20, described in the first embodiment, are performed. The process then returns to step S11.

If in step S51, all the memory cell transistors MT have passed the first verification (step S51, YES), program data is transferred as is the case with step S11 (step S54). The second programming is then performed (step S55).

After the programming in step S55, the control circuit 6 references the results of the verification. If all the memory cell transistors MT have passed the second verification, the process proceeds to step S21 to complete the write operation. On the other hand, if the second verification has missed for any memory cell transistor MT, the control circuit 6 performs the second verification for the "0" data to the "F" data (step S57). Then, the control circuit 6 instructs the voltage generation circuit 7 to step up VPGM. At this time, the VPGM is stepped up by $\Delta$VPGM2, which is smaller than $\Delta$VPGM1 (step S58). Thereafter, the operations in steps S19 and S20, described in the first embodiment, are performed. The process then returns to step S54.

As described above, first, the step-up range $\Delta$VPGM1 may be used to perform the programming (first programming) such that all the memory cell transistors MT in selected page pass the first verification. Then, the step-up range $\Delta$VPGM2 may be used to perform the programming (second programming) such that all the memory cell transistors MT in the selected page pass the second verification. Even the present technique exerts the effect (3). Of course, the present embodiment is applicable to the second and third embodiments.

If it is already known that the condition VPGM<VPGMth is always met during the first programming, the operations in steps S19 and S20 may be omitted. On the other hand, if VPGM is known to inevitably reach VPGMth during the first programming, the operation in step S59 can be omitted. Without these pieces of information, the operations in steps S19, S20, S59, and S60 need to be performed as shown in FIG. 18.

As described above, with the semiconductor memory device and the method of writing data to the semiconductor memory device according to any of the first to fifth embodiments, the semiconductor device includes the driver circuits 3 and 5. The driver circuits 3 and 5 repeats the programming operation of selecting any one of the word lines, of applying the first voltage (VPGM) to the selected word line, and of applying the second voltage (VPASS) to the unselected word lines. Thus, data is written to the memory cell transistors MT connected to the selected word line. While the driver circuits 3 and 5 are repeating the programming operation, the control circuit 6 increases the first voltage, and keeps the second voltage constant until the first voltage reaches the threshold voltage VPGMth. When the first voltage reaches the threshold voltage VPGMth, the second voltage starts to be increased.

In other words, first, the step is carried out which programs data by applying the first voltage (VPGM) to the gate of each of the selected memory cells and applying the second voltage (VPASS), which is lower than the first voltage, to the gate of each of the unselected memory cells. Then, the step is carried out which repeats the programming while increasing the first voltage with the second voltage kept constant. Thereafter, after the first voltage reaches the first threshold voltage (VPGMth), the step is carried out which performs the above-described programming with the voltage applied to the gate of each of the unselected memory cells changed to the third voltage (VPASS=VPASS+ΔVPASS), which is different from the second voltage.

Thus, for the memory cell transistors MT connected to the selected word line and the unselected bit lines, the channel potential can be increased compared to that obtained in the prior art, by increasing VPASS. For the memory cell transistors MT connected to the unselected word lines and the selected bit line, the channel potential can be prevented from increasing excessively by starting to increase VPASS in the middle of the write operation rather than at the beginning of the write operation. Thus, the data can be inhibited from being erroneously written to the memory cell transistors MT not to be programmed.

Figure 19:
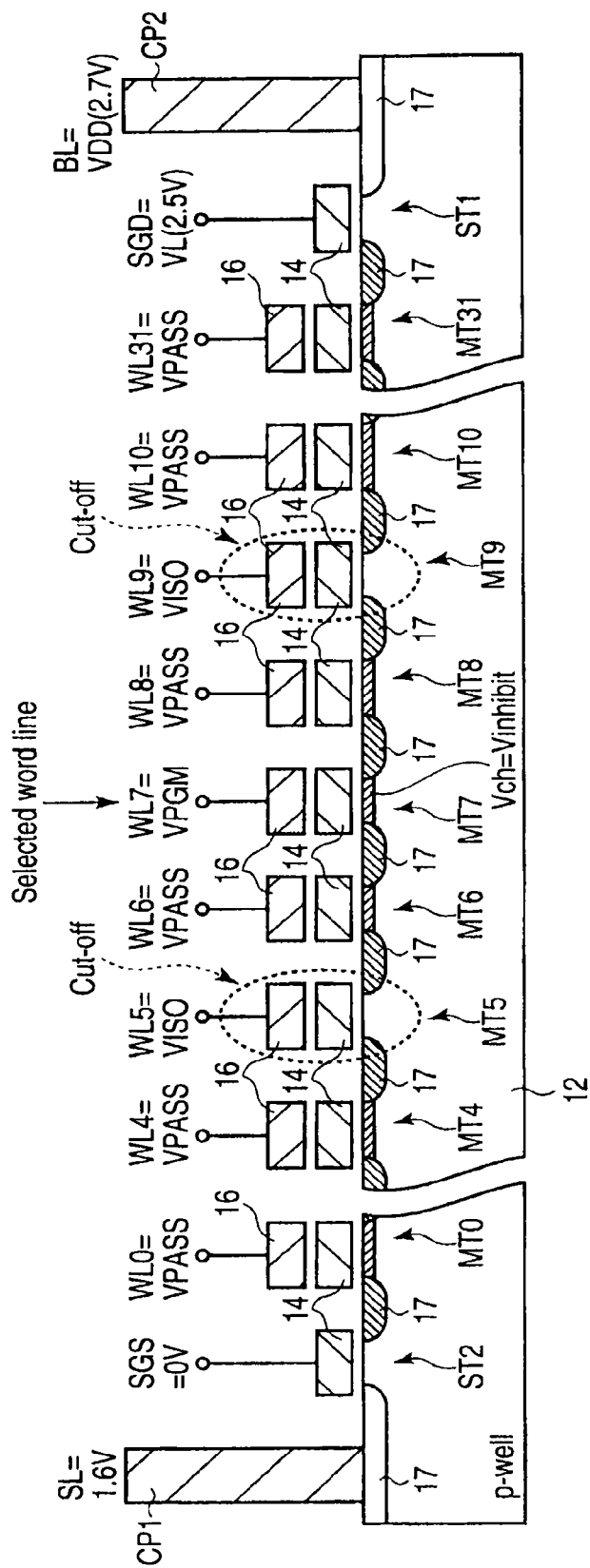
FIG. 19 is a sectional view of a memory cell array according to a second modification of the first to fourth embodiments.
Figure 20:
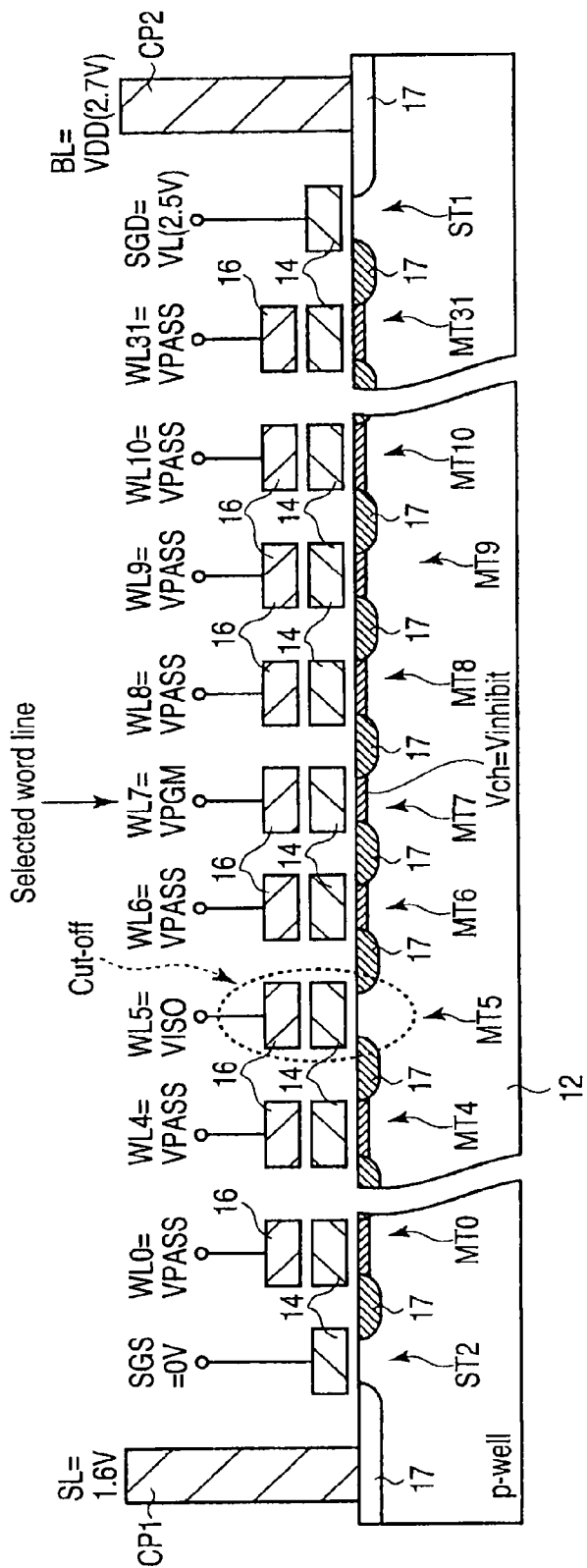
FIG. 20 is sectional view of a memory cell array according to a third modification of the first to fourth embodiments.

In the above-described embodiment, all the memory cell transistors MT included in the NAND cell contribute to the self-boosting by way of example. That is, in the above description, VPASS is applied to all the unselected word lines. However, not all the memory cell transistors MT need to contribute to the self-boosting. Such an example will be described with reference to FIGS. 19 and 20. FIGS. 19 and 20 are sectional views of the NAND cell during the programming; the NAND cell is connected to the unselected bit line. In both figures, the selected word line is the word line WL7.

First, as shown in FIG. 19, VPGM is applied to the selected word line WL7. The unselected word lines are the word lines WL0 to WL6 and WL8 to WL31, and a voltage VISO is applied to the unselected word lines WL5 and WL9. VPASS is applied to the other unselected word lines WL0 to WL4, WL6, WL8, and WL10 to WL31. The voltage VISO is lower than VPASS and allows the memory cell transistor MT to be turned off.

In FIG. 19, the memory cell transistors MT5 and MT9 with VISO applied to the control gate thereof are brought into the cutoff state. That is, the channels of the memory cell transistors MT6 to MT8 are electrically separated from the channels of the memory cell transistors MT0 to MT4 and MT10 to MT31. Thus, the channel potential Vch of the memory cell transistor MT7 connected to the selected word line WL7 is increased by coupling to the word lines WL6 to WL8. That is, only the word lines WL6 to WL8 contribute to the self-boosting. Thus, the channel potential Vch can be efficiently boosted by limiting the number of word lines contributing to the self-boosting.

FIG. 20 shows another example. In the case shown in FIG. 20 corresponds to the case shown in FIG. 19 and in which VPASS is applied to the word line WL7. In this case, the channel potential Vch of the memory cell transistor MT7 connected to the selected word line WL7 is increased by coupling to the word lines WL6 to WL31. That is, only the word lines WL6 to WL31 contribute to the self-boosting. Thus, boost efficiency can be improved by increasing the rate of those of the memory cell transistors MT contributing to the self-boosting which are in an erase state.

The above-described embodiments may have only to use VPASS with at least two types of values. That is, the number of times that VPASS is stepped has only to be at least one. This will be described with reference to FIG. 21. FIG. 21 is a timing chart of the program voltage VPGM and the voltage VPASS. As shown in the figure, when the write operation is performed for a certain selected word line, VPASS may be stepped up during the last programming. Even in this case, the above-described effects can be exerted.

Furthermore, FIGS. 8 and 12 show that after VPGM exceeds VPGMth, VPASS is sequentially stepped up. However, after VPASS is stepped up after VPGM has exceeded VPGMth, VPASS may be kept constant at the stepped-up value.

Additionally, the threshold voltage VPGMth, described above in the embodiments, may be variable. Similarly, the threshold voltage VPGMth2, described in the second embodiment, may be variable.

Moreover, the initial value of the program voltage VPGM is determined by trimming for each chip or each page. That is, the program voltage VPGM may vary with the chip or page. Thus, in this case, the threshold voltages VPGMth and VPGMth2 may vary in conjunction with the program voltage VPGM determined by the trimming. That is, the threshold voltages VPGMth and VPGMth2 may be varied with the chip or page.

Moreover, in the description of the first to fourth embodiments, ΔVPGM is constant. However, ΔVPGM may be variable. In this case, ΔVPGM is determined by the control circuit 6. Thus, even with a variation in ΔVPGM, VPGMth is desirably constant. However, the control circuit 6 may vary VPGMth depending on the characteristics of the NAND flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells for which current path is connected in series and each of which includes a charge accumulation layer and a control gate;
   word lines each connected to the control gate of a corresponding one of the memory cells;
   a driver circuit which repeats a programming operation of selecting any one of the word lines, of applying a first voltage to selected one of the word lines, and of applying a second voltage to an unselected one of the word lines, and of applying a third voltage less than the second voltage to another unselected one of the word lines; and
   a control circuit which, while the driver circuit is repeating the programming operation, steps up the first voltage and keeps the second voltage constant until the first voltage reaches a first threshold, the control circuit stepping up the second voltage after the first voltage has reached the first threshold.

2. The device according to claim 1, wherein the control circuit steps up the second voltage and the third voltage by voltage values different from each other.

3. The device according to claim 1, wherein the control circuit keeps the third voltage at a constant value when the second voltage is stepped-up.

4. The device according to claim 1, wherein the third voltage turns off the memory cells.

5. The device according to claim 1, wherein the selected one of the word lines is located between the unselected one of the word lines and the another unselected of the word lines.

6. The device according to claim 5, further comprising
a bit line electrically connected to one side of the current path of the memory cells, and
a source line electrically connected to another side of the current path of the memory cells,
wherein the another unselected one of the word lines is closer to the source line than the unselected one of the word lines is.

7. The device according to claim 1, wherein the driver circuit applies the second voltage to still another unselected one of the word lines.

8. The device according to claim 7, wherein the still another unselected one of the word lines is located between the selected one of the word lines and the another unselected one of the word lines.

9. The device according to claim 7, further comprising
a bit line electrically connected to one side of the current path of the memory cells, and
a source line electrically connected to another side of the current path of the memory cells,
wherein the still another unselected one of the word lines is located between the another unselected one of the word lines and the source line.

10. The device according to claim 1, wherein when the first voltage reaches a second threshold, the control circuit stops the step-up of the second voltage and keeps the second voltage constant.

11. The device according to claim 1, wherein the control circuit performs a verification operation upon performing a first programming operation of the data write operation and upon performing a last programming operation of a data write operation.

12. The device according to claim 1, further comprising:
a bit line electrically connected to one side of the current path of the memory cells; and
a column controller which applies a fourth voltage to the bit line during the programming operation,
wherein during repetition of the programming operation, the column controller reduces the fourth voltage after the threshold voltage of the selected one of the memory cells reaches a predetermined level.

13. The device according to claim 12, wherein the control circuit reduces the step-up range of the first voltage after the threshold voltage of the selected one of the memory cells reaches the predetermined level.

14. The device according to claim 1, wherein the first threshold is variable.

15. The device according to claim 10, wherein the second threshold is variable.

16. The device according to claim 14, wherein the control circuit trims the first voltage for each of the word lines, and
the control circuit varies the first threshold in conjunction with the trimmed first voltage.

17. The device according to claim 15, wherein the control circuit trims the first voltage for each of the word lines, and
the control circuit varies the second threshold in conjunction with the trimmed first voltage.

* * * * *